US012635556B2

(12) United States Patent
Saito

(10) Patent No.: US 12,635,556 B2
(45) Date of Patent: May 19, 2026

(54) SEMICONDUCTOR DEVICE

(71) Applicant: ROHM CO., LTD., Kyoto (JP)

(72) Inventor: Koshun Saito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 18/752,182

(22) Filed: Jun. 24, 2024

(65) Prior Publication Data

US 2024/0347405 A1      Oct. 17, 2024

Related U.S. Application Data

(63) Continuation of application No. 18/317,699, filed on May 15, 2023, now Pat. No. 12,051,633, which is a
(Continued)

(30) Foreign Application Priority Data

Sep. 19, 2018    (JP) ................................. 2018-174815

(51) Int. Cl.
*H01L 23/31*        (2006.01)
*H01L 23/00*        (2006.01)
*H01L 23/495*       (2006.01)

(52) U.S. Cl.
CPC .... *H01L 23/3121* (2013.01); *H01L 23/49513* (2013.01); *H01L 23/49562* (2013.01);
(Continued)

(58) Field of Classification Search
CPC ... H01L 23/28; H01L 23/3121; H01L 23/495; H01L 2224/04042; H01L 2224/05552;
(Continued)

(56) References Cited

U.S. PATENT DOCUMENTS 5,200,364 A      4/1993  Loh
5,585,665 A      12/1996  Anjoh et al.
(Continued)

FOREIGN PATENT DOCUMENTS

JP          8-97333 A      4/1996
JP      2005-26294 A      1/2005
(Continued)

OTHER PUBLICATIONS

International Search Report issued in PCT/JP2019/036556, Nov. 26, 2019 (2 pages).
(Continued)

*Primary Examiner* — Ori Nadav
(74) *Attorney, Agent, or Firm* — HSML P.C.

(57) ABSTRACT

A semiconductor device includes a semiconductor element, first and second leads, and a sealing resin. The semiconductor element includes first and second electrodes. The first lead includes a mounting base having a main face to which the first electrode is bonded and a back face, and includes a first terminal connected to the first electrode. The second lead includes a second terminal connected to the second electrode. The sealing resin includes a main face and a back face opposite to each other, and includes an end face oriented in the protruding direction of the terminals. The back face of the mounting base is exposed from the back face of the resin. The sealing resin includes a groove formed in its back face and disposed between the back face of the mounting base and a boundary between the second terminal and the end face of the resin.

14 Claims, 20 Drawing Sheets

Related U.S. Application Data continuation of application No. 17/960,632, filed on Oct. 5, 2022, now Pat. No. 11,854,923, which is a continuation of application No. 17/268,277, filed as application No. PCT/JP2019/036556 on Sep. 18, 2019, now Pat. No. 11,502,014.

(52) U.S. Cl.
CPC .............. *H01L 24/29* (2013.01); *H01L 24/32* (2013.01); *H01L 24/45* (2013.01); *H01L 24/48* (2013.01); *H01L 24/73* (2013.01); *H01L 2224/29111* (2013.01); *H01L 2224/29139* (2013.01); *H01L 2224/29147* (2013.01); *H01L 2224/29155* (2013.01); *H01L 2224/29166* (2013.01); *H01L 2224/32245* (2013.01); *H01L 2224/45124* (2013.01); *H01L 2224/48175* (2013.01); *H01L 2224/73265* (2013.01)

(58) Field of Classification Search
CPC ... H01L 2224/05554; H01L 2224/0603; H01L 2224/29111; H01L 2224/29139; H01L 2224/29147; H01L 2224/29155; H01L 2224/29166; H01L 2224/29339; H01L 2224/32245; H01L 2224/45124; H01L 2224/48175; H01L 2224/48247; H01L 2224/49171; H01L 2224/73265; H01L 2224/8384; H01L 23/3107; H01L 23/315; H01L 23/48; H01L 23/49513; H01L 23/49562; H01L 24/05; H01L 24/06; H01L 24/29; H01L 24/32; H01L 24/45; H01L 24/48; H01L 24/49; H01L 24/73; H01L 2924/00012; H01L 2924/00014; H01L 2924/01028; H01L 2924/01029; H01L 2924/01047; H01L 2924/181
USPC ....................................................... 257/666
See application file for complete search history.

(56) References Cited

U.S. PATENT DOCUMENTS

| | | | |
|---|---|---|---|
| 5,648,680 | A | 7/1997 | Ogawa |
| 5,935,502 | A | 8/1999 | Ferri et al. |
| 6,072,231 | A | 6/2000 | Murakami et al. |
| 6,208,020 | B1 | 3/2001 | Minamio et al. |
| 6,756,610 | B2 * | 6/2004 | Sakamoto .......... H10H 20/8506 |
| | | | 257/E33.059 |
| 9,966,517 | B2 | 5/2018 | Oda et al. |
| 10,157,815 | B2 | 12/2018 | Hatasa et al. |
| 10,790,258 | B2 | 9/2020 | Matsubara et al. |
| 2002/0113299 | A1 | 8/2002 | Kinsman et al. |
| 2007/0052072 | A1 | 3/2007 | Iwade et al. |
| 2012/0061822 | A1 * | 3/2012 | Pagaila ................... H01L 24/16 |
| | | | 257/737 |
| 2015/0162274 | A1 | 6/2015 | Kadoguchi et al. |
| 2015/0325763 | A1 | 11/2015 | Oda et al. |
| 2016/0190414 | A1 | 6/2016 | Miyamoto |
| 2016/0254214 | A1 | 9/2016 | Makino |
| 2016/0293549 | A1 | 10/2016 | Otremba et al. |
| 2016/0293817 | A1 | 10/2016 | Oda et al. |
| 2019/0074431 | A1 | 3/2019 | Hasegawa et al. |

FOREIGN PATENT DOCUMENTS

| | | |
|---|---|---|
| JP | 2007-73743 A | 3/2007 |
| JP | 2014-179541 A | 9/2014 |
| JP | 2015-130465 A | 7/2015 |
| JP | 2017-112279 A | 6/2017 |
| JP | 2017-147433 A | 8/2017 |
| JP | 2018-14490 A | 1/2018 |

OTHER PUBLICATIONS

Decision of Refusal received in the corresponding Japanese Patent application, Aug. 16, 2022, and machine translation (8 pages).
Office Action received in the corresponding Chinese Patent application, May 10, 2023, and machine translation (15 pages).
Office Action received in the corresponding Japanese Patent application, Oct. 3, 2023, and machine translation (10 pages).
Office Action received in the corresponding Chinese Patent application, Nov. 22, 2023, and machine translation (10 pages).
Decision of Rejection received in the corresponding Chinese Patent application, Mar. 21, 2024 and machine translation (15 pages).
Office Action issued in corresponding Japanese Patent application No. 2024-032255, Mar. 25, 2025, and machine translation (8 pages).

* cited by examiner

SEMICONDUCTOR DEVICE

CROSS-REFERENCE TO RELATED APPLICATIONS

This application is a continuation application of U.S. application Ser. No. 18/317,699, filed May 15, 2023, which is a continuation application of U.S. application Ser. No. 17/960,632, filed Oct. 5, 2022, which is a continuation application of U.S. application Ser. No. 17/268,277, filed Feb. 12, 2021, which is a National Stage Application of PCT/JP2019/036556, filed Sep. 18, 2019, which claims priority to Japan Patent Application No. 2018-174815 filed Sep. 19, 2018, the entire contents of each of which are incorporated herein by reference, including the original claims.

TECHNICAL FIELD

The present disclosure relates to a semiconductor device.

BACKGROUND ART

Various configurations have been proposed regarding a semiconductor device. For example, patent document 1 discloses an example of conventional semiconductor devices. The semiconductor device disclosed in the above document includes a semiconductor element, a die pad (with a Ni-plated surface), a plurality of leads (drain lead, source lead, and gate lead), and a sealing resin. A source electrode and a gate electrode are formed on the main face, and a drain electrode is formed on the back face, of the semiconductor element. The semiconductor element is mounted on the main face of the die pad, the drain electrode being electrically connected to the die pad. The drain lead is formed integrally with the die pad, and electrically connected to the drain electrode. The source lead and the gate lead are respectively connected to the source electrode and the gate electrode, via a wire. The sealing resin covers the semiconductor element and a part of each lead. The back face of the die pad is exposed from the sealing resin.

In the semiconductor device configured as above, when a high voltage (e.g., thousands of volts) is applied between the drain lead and the source lead, a discharge takes place on the surface of the sealing resin, and between the exposed back face of the die pad and the source lead, which may cause a short circuit between the drain lead and the source lead. Accordingly, there still is room for improvement with the existing semiconductor device, from the viewpoint of improving the withstand voltage.

CITATION LIST

Patent Document

PATENT DOCUMENT 1: JP-A-2014-179541

SUMMARY OF THE INVENTION

Problem to be Solved by the Invention

In view of the foregoing situation, an object of the present disclosure is to provide a semiconductor device with an improved withstand voltage.

Means to Solve the Problem

In accordance with an aspect of the present disclosure, there is provided a semiconductor device that includes semiconductor element, a first lead, a second lead and a sealing resin. The semiconductor element includes: an element main face and an element back face that face opposite to each other in a thickness direction; a first electrode located on the element back face; and a second electrode located on the element main face. The first lead includes: a mounting base having a mounting base main face to which the first electrode of the semiconductor element is bonded and a mounting base back face opposite to the mounting base main face in the thickness direction; and a first terminal electrically connected to the first electrode via the mounting base. The second lead includes a second terminal electrically connected to the second electrode. The sealing resin covers a part of each of the first lead and the second lead, and the semiconductor element. The first terminal and the second terminal protrude from the sealing resin. The sealing resin includes: a resin main face and a resin back face oriented in opposite directions to each other in the thickness direction; a resin end face connecting the resin main face and the resin back face, and oriented in the direction in which the first terminal and the second terminal protrude; and a pair of resin side faces each connecting the resin main face and the resin back face, and connected to the resin end face. The mounting base back face is exposed from the resin back face. The sealing resin includes a back face displaced portion located on the resin back face, at a position between the mounting base back face and a boundary between the second terminal and the resin end face, where the back face displaced portion includes a portion deviated from the resin back face in the thickness direction.

Advantages of the Invention

In the semiconductor device configured as above, the sealing resin includes the back face displaced portion located on the resin back face at the position between the mounting base back face and the boundary between the second terminal and the resin end face, where the back face displaced portion includes a portion deviated from the resin back face in the thickness direction. Accordingly, it is possible to prolong the creepage distance, which is the distance along the surface of the sealing resin, between the portion of the second terminal exposed from the sealing resin and the mounting base back face. The longer the creepage distance is, the higher withstand voltage can be attained. Therefore, the semiconductor device according to the present disclosure can have an improved withstand voltage.

Other features and advantages of the present disclosure will become more apparent, through the detailed description given hereunder with reference to the accompanying drawings.

BRIEF DESCRIPTION OF THE DRAWINGS

FIG. 2 is a perspective view showing the opposite side of the semiconductor device shown in FIG. 1.

MODE FOR CARRYING OUT THE INVENTION

Figure 3:
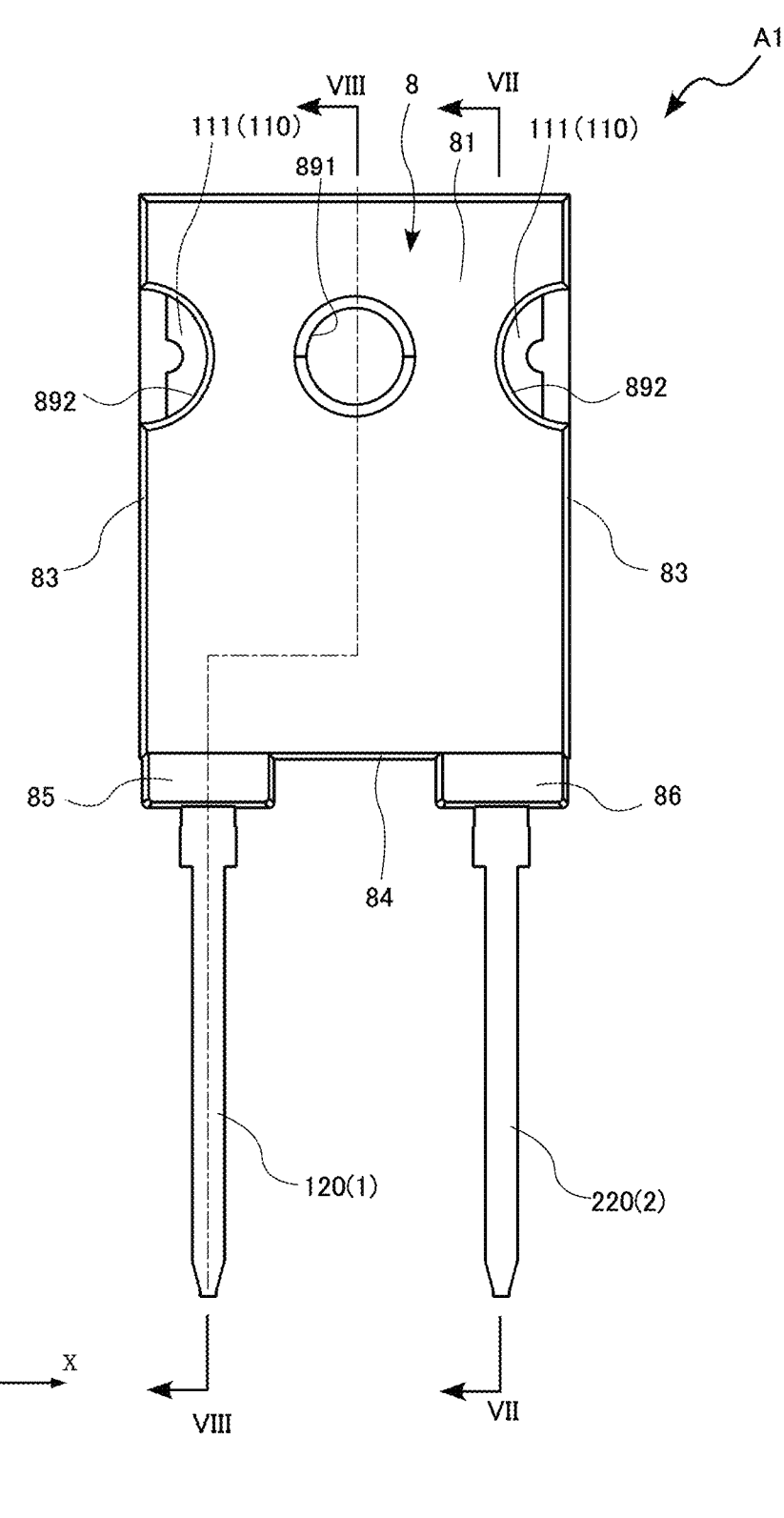
FIG. 3 is a plan view showing the semiconductor device shown in FIG. 1.
Figure 4:
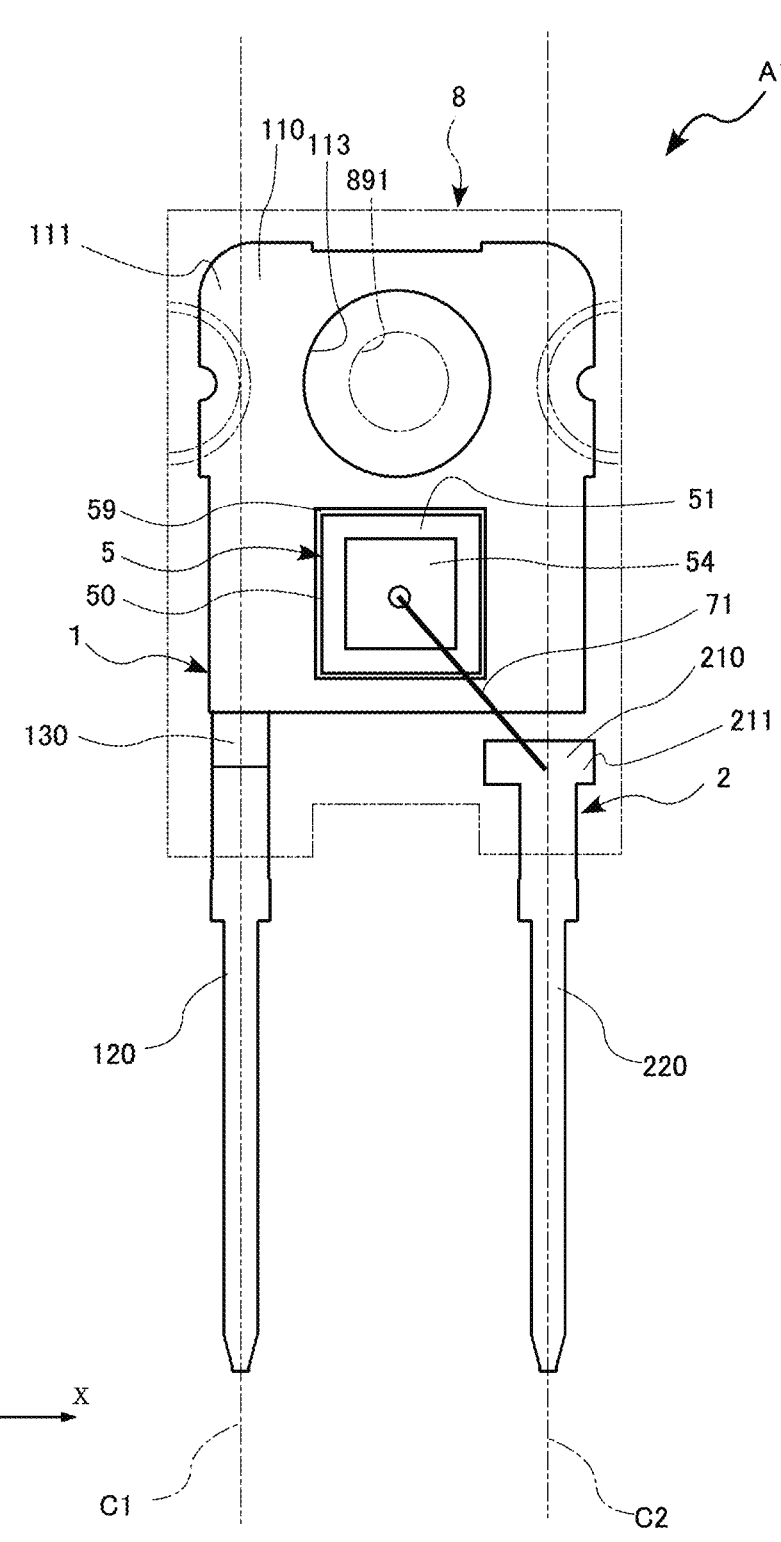
FIG. 4 is a plan view showing the semiconductor device shown in FIG. 1, seen through a sealing resin.

Preferred embodiments of the present disclosure will be described with reference to the accompanying drawings. Referring first to FIG. 1 to FIG. 8, a semiconductor device A1 according to a first embodiment of the present disclosure will be described. As shown in FIG. 4, the semiconductor device A1 includes a plurality of leads, a semiconductor element 5, a bonding wire 71, and a sealing resin 8. In this embodiment, the plurality of leads includes two leads, namely a first lead 1 and a second lead 2. However, the present disclosure is not limited to this configuration. The number of leads is determined depending on the type of the semiconductor element 5 (e.g., the number of electrodes), and three, four, or five leads may be provided.

Figure 1:
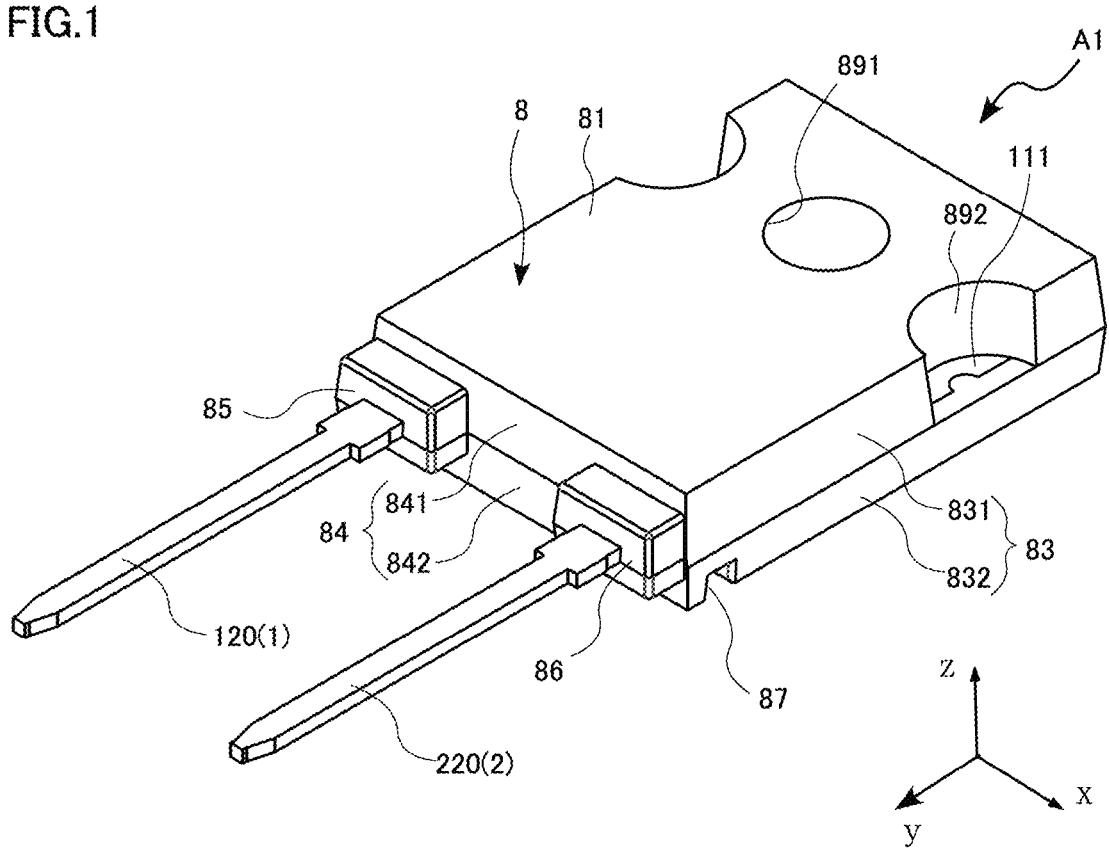
FIG. 1 is a perspective view showing a semiconductor device according to a first embodiment.
Figure 5:
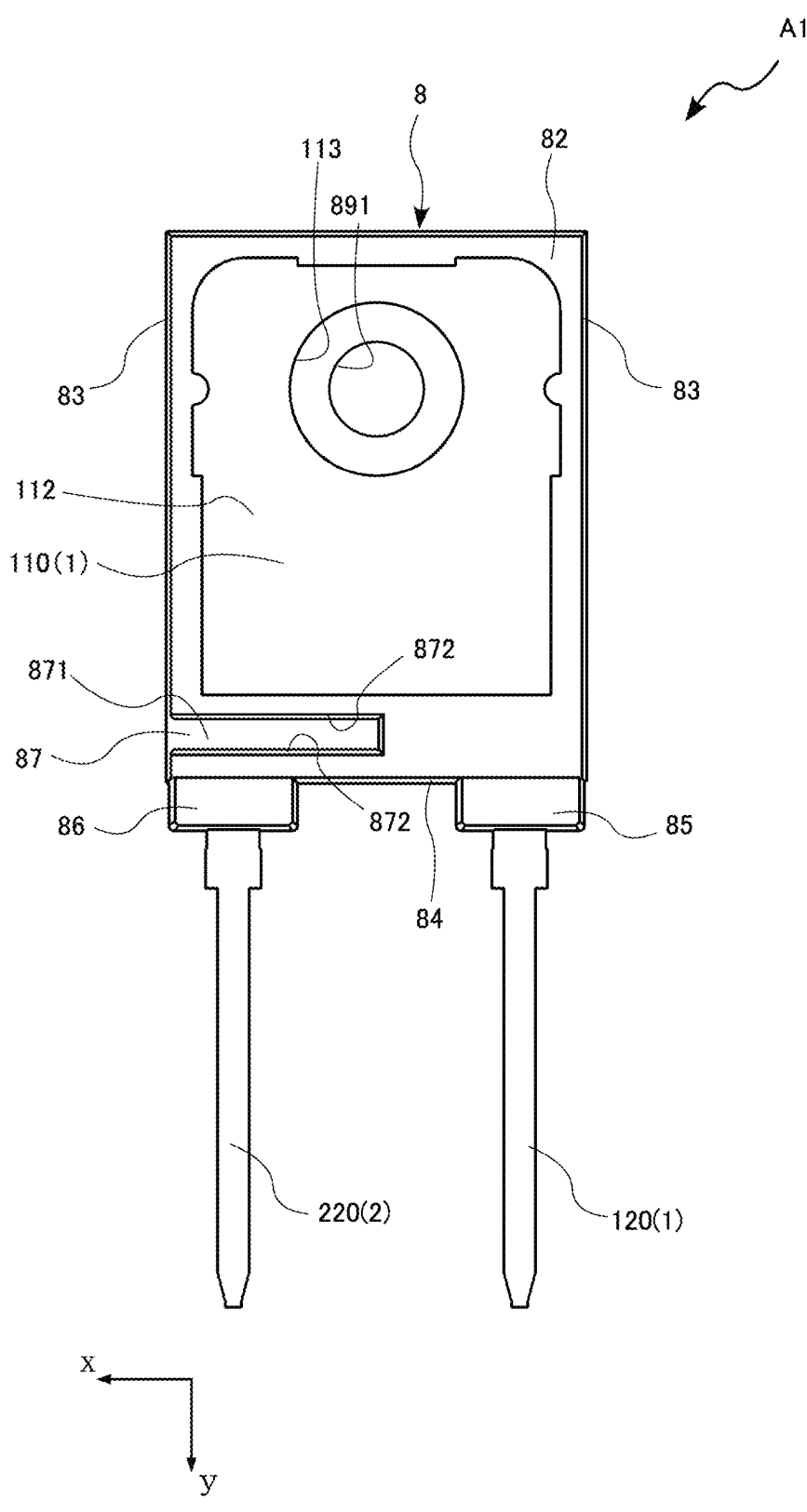
FIG. 5 is a bottom view showing the semiconductor device shown in FIG. 1.
Figure 6:
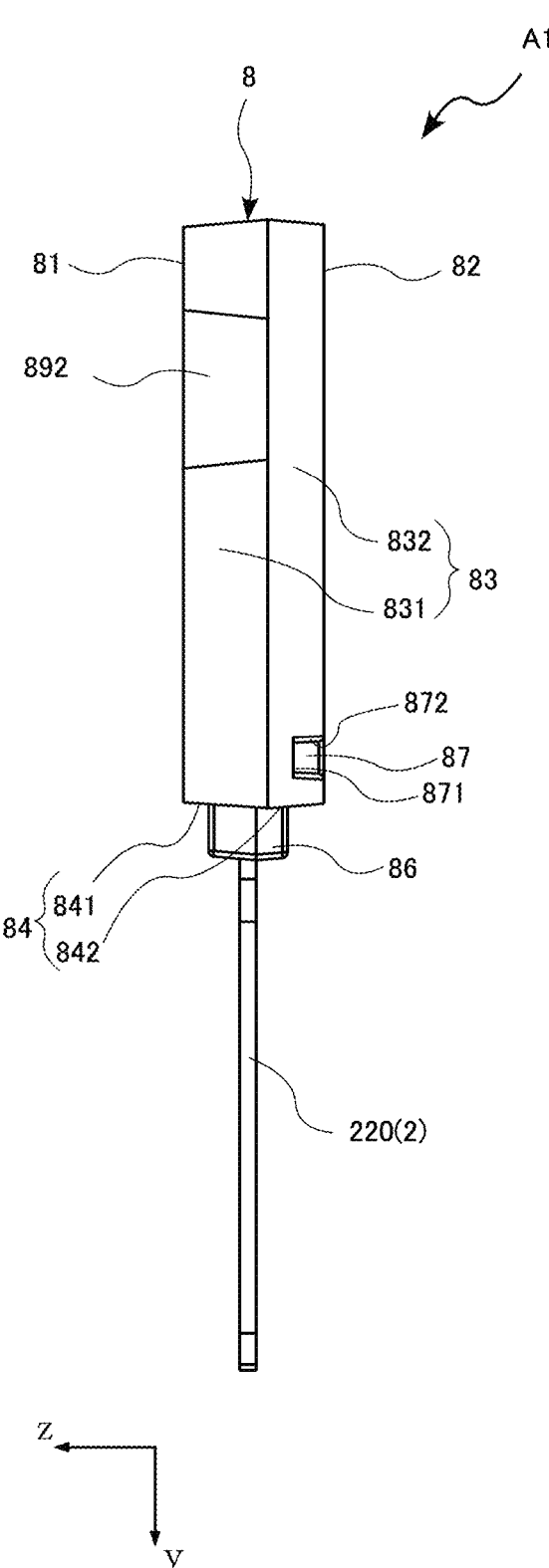
FIG. 6 is a right-side view showing the semiconductor device shown in FIG. 1.
Figure 7:
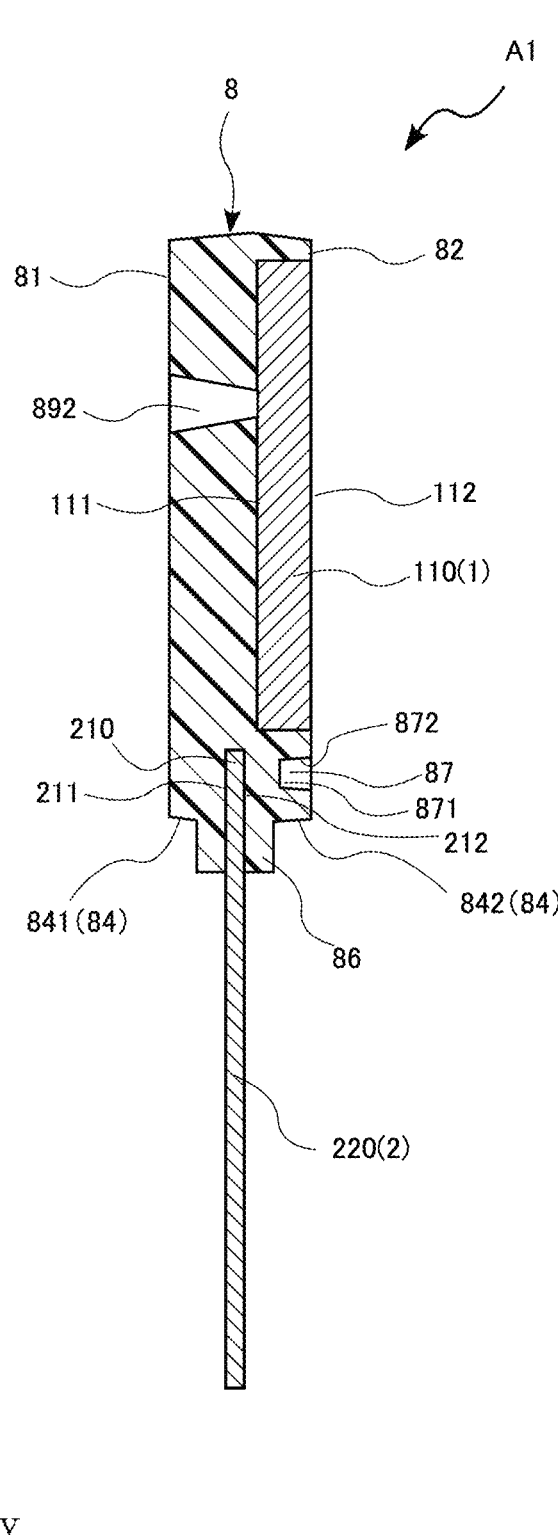
FIG. 7 is a cross-sectional view taken along a line VII-VII in FIG. 3.
Figure 8:
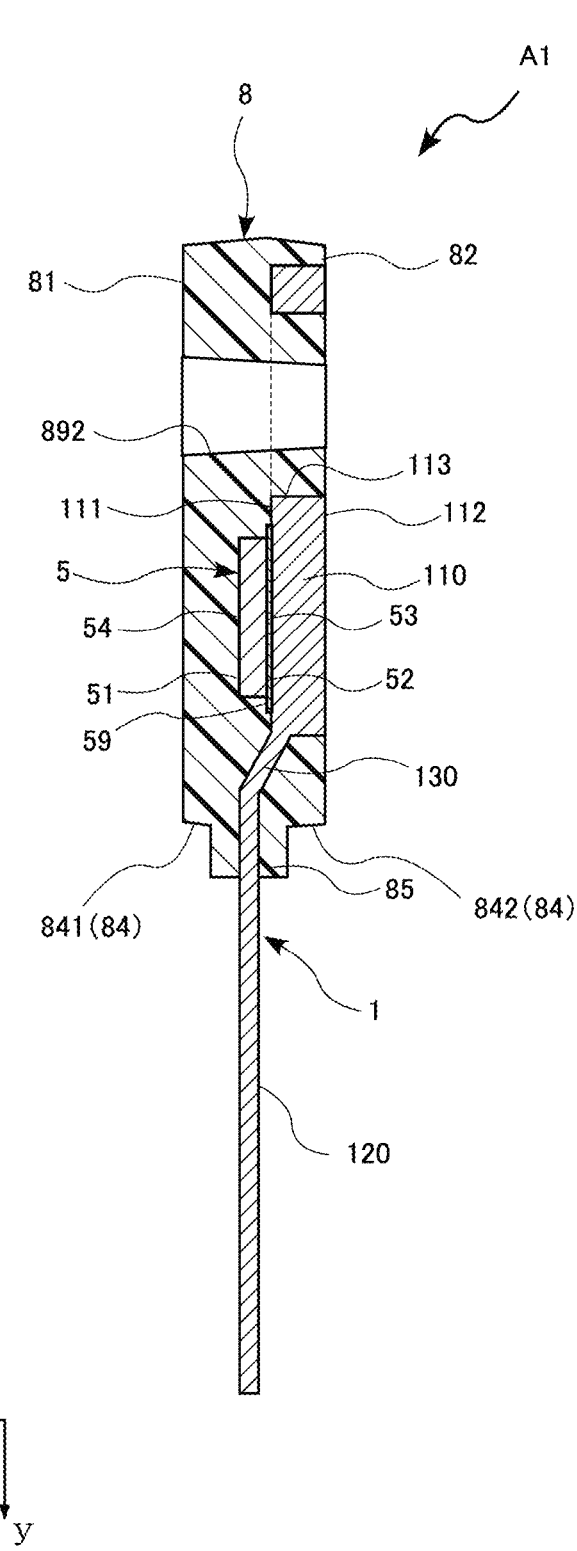
FIG. 8 is a cross-sectional view taken along a line VIII-VIII in FIG. 3.

FIG. 1 is a perspective view showing the semiconductor device A1. FIG. 2 is a perspective view showing the bottom face of the semiconductor device A1. FIG. 3 is a plan view showing the semiconductor device A1. FIG. 4 is a plan view showing the semiconductor device A1 seen through the sealing resin 8 (indicated by dash-dot-dot lines), for the sake of clarity. FIG. 5 is a bottom view showing the semiconductor device A1. FIG. 6 is a right-side view showing the semiconductor device A1. FIG. 7 is a cross-sectional view taken along a line VII-VII in FIG. 3. FIG. 8 is a cross-sectional view taken along a line VIII-VIII in FIG. 3.

The semiconductor device A1 is, for example, mounted on a circuit board of an electronic apparatus. However, the present disclosure is not limited to such a use. For convenience of the description, three directions orthogonal to one another, namely an x-direction, a y-direction, and a z-direction, will be referred to. The z-direction corresponds to the thickness direction of the semiconductor device A1. The y-direction corresponds to the direction in which terminals (120, 220) of the semiconductor device A1 extend. The sealing resin 8 has a generally rectangular shape as viewed in the z-direction. The size of the semiconductor device A1 is not specifically limited. As an example, in this embodiment the size of the sealing resin 8 is approximately 15 mm in the x-direction, approximately 20 mm in the y-direction, and approximately 5 mm in the z-direction. The length of the terminals protruding from the sealing resin 8 is approximately 20 mm.

The first lead 1 and the second lead 2 are electrically connected to the semiconductor element 5, and each constitute a conduction path between the semiconductor element 5 and a circuit wiring, when the semiconductor device A1 is mounted on a circuit board. The first lead 1 and the second lead 2 are formed, for example, by punching or bending a metal plate. The leads 1 to 3 are formed of a metal, preferably either Cu or Ni, an alloy thereof, or a 42Ni alloy. In this embodiment, it will be assumed that the first lead 1 and the second lead 2 are formed of Cu. In this embodiment, the first lead 1 and the second lead 2 each have a thickness of approximately 0.5 to 1 mm.

The first lead 1 supports the semiconductor element 5, and is electrically connected to the semiconductor element 5. The first lead 1 includes a mounting base 110, a first terminal 120, and a joint portion 130.

The mounting base 110 is the portion on which the semiconductor element 5 is to be mounted, and has a generally rectangular shape as viewed in the z-direction. The mounting base 110 includes a mounting base main face 111 and a mounting base back face 112. The mounting base main face 111 and the mounting base back face 112 are arranged to face in opposite directions to each other in the z-direction. The mounting base main face 111 faces to the left in FIG. 6 to FIG. 8. The mounting base main face 111 is the face on which the semiconductor element 5 is to be mounted. The mounting base back face 112 faces to the right in FIG. 6 to FIG. 8. The mounting base back face 112 is exposed from the sealing resin 8, and constitutes a back face terminal. The mounting base 110 also includes a mounting base through-hole 113, formed throughout between the mounting base main face 111 and the mounting base back face 112, parallel to the z-direction. The mounting base through-hole 113 is located at a central position of the mounting base 110 in the x-direction and on the side of an end portion in the y-direction (upper side in FIG. 4), and has a circular shape as viewed in the z-direction. The position and the shape of the mounting base through-hole 113 are not limited to the illustrated example.

The first terminal 120 extends in the y-direction, and is partially exposed from the sealing resin 8. The first terminal 120 is electrically connected to the semiconductor element 5, via the joint portion 130 and the mounting base 110.

The joint portion 130 is connected to the mounting base 110 and the first terminal 120, thus constituting a joint between the mounting base 110 and the first terminal 120. As shown in FIG. 8, The mounting base 110 and the first terminal 120 are located at different positions in the z-direction, such that the first terminal 120 is located on the left in FIG. 8, with respect to the mounting base 110. Accordingly, the joint portion 130 is inclined with respect to the mounting base 110 and the first terminal 120. When the mounting base main face 111 and the face of the first terminal 120 that face in the same direction as the mounting base main face 111 are located at the same position in the z-direction, the joint portion 130 does not have to be inclined. The joint portion 130 is entirely covered with the sealing resin 8.

The first terminal 120 and the joint portion 130 have the same thickness (size in the z-direction), which is thinner than that of the mounting base 110. The first terminal 120 and the joint portion 130 may be formed, for example, through a half etching process. The thickness of the mounting base 110 may be the same as that of the first terminal 120 and the joint portion 130. As shown in FIG. 4, the joint portion 130 and the first terminal 120 are located on the lower side of the mounting base 110 in the y-direction, and on the left side in the x-direction. In this embodiment, as shown in FIG. 4, an imaginary line C1 (dash-dot line) extended from center line of the first terminal 120 in the y-direction does not intersect the semiconductor element 5 and the mounting base through-hole 113. The position of the first terminal 120 in the x-direction is not limited to the illustrated example.

The second lead 2 is electrically connected to the semiconductor element 5. The second lead 2 is spaced apart from the first lead 1 and, as shown in FIG. 4, located on the lower side of the mounting base 110 of the first lead 1 in the y-direction, and on the right side in the x-direction. The second lead 2 includes a wire bonding region 210 and a second terminal 220.

The wire bonding region 210 is where the bonding wire 71 is to be bonded, and has a rectangular shape having the longer sides extending in the x-direction as viewed in the z-direction. As shown in FIG. 7, the wire bonding region 210 includes a wire bonding region main face 211 and a wire bonding region back face 212. The wire bonding region main face 211 and the wire bonding region back face 212 are arranged to face in opposite directions to each other, in the z-direction. The wire bonding region main face 211 faces to the left in FIG. 6 to FIG. 8. The wire bonding region main face 211 is the face on which the bonding wire 71 is bonded (see FIG. 4). The wire bonding region back face 212 faces to the right in FIG. 6 to FIG. 8. The wire bonding region 210 is entirely covered with the sealing resin 8.

The second terminal 220 is connected to the wire bonding region 210, and extends in the y-direction such that a part of the second terminal 220 is exposed from the sealing resin 8. The second terminal 220 is electrically connected to the semiconductor element 5, via the wire bonding region 210 and the bonding wire 71.

The wire bonding region 210 and the second terminal 220 have the same thickness (size in the z-direction), which is same as that of the first terminal 120 and the joint portion 130 of the first lead 1. The portion of the first terminal 120 exposed from the sealing resin 8 and the portion of the second terminal 220 exposed from the sealing resin 8 have the same shape, and the distal end of the first terminal 120 (opposite to the end connected to the joint portion 130), and the distal end of the second terminal 220 (opposite to the end connected to the wire bonding region 210) are located at the same position in the y-direction. In this embodiment, as shown in FIG. 4, an imaginary line C2 (dash-dot line) extended from the center line of the second terminal 220 in the y-direction does not intersect the semiconductor element 5 and the mounting base through-hole 113. The position of the second terminal 220 in the x-direction is not limited to the illustrated example. It is preferable that the first terminal 120 and the second terminal 220 are distant from each other in the x-direction.

The semiconductor element 5 serves to perform the electrical functions of the semiconductor device A1. In this embodiment, the semiconductor element 5 is a diode. The semiconductor element 5 includes an element main body 50, an element main face 51, an element back face 52, a first electrode 53, and a second electrode 54.

As shown in FIG. 8, the element main face 51 and the element back face 52 are arranged to face in opposite directions in the z-direction. The element main face 51 faces to the left in FIG. 6 to FIG. 8. The element back face 52 faces to the right in FIG. 6 to FIG. 8. The first electrode 53 is located on the element back face 52. The second electrode 54 is located on the element main face 51. In this embodiment, the first electrode 53 is a cathode electrode, and second electrode 54 is an anode electrode.

As shown in FIG. 4, the semiconductor element 5 is located at the central position of the mounting base main face 111 in the x-direction, so as not to interfere with the mounting base through-hole 113 as viewed in the z-direction. As shown in FIG. 8, the semiconductor element 5 is mounted on the mounting base main face 111 via a conductive bonding material 59, with the element back face 52 opposed to the mounting base main face 111. Accordingly, the first electrode 53 of the semiconductor element 5 is bonded to the mounting base main face 111 via the bonding material 59, thus to be electrically connected to the first lead 1. Examples of the bonding material 59 include a TiNiAg-based solder, a SnAgCu-based solder, and a conductive bonding material formed of a sintered Ag. As shown in FIG. 4, the bonding wire 71 is connected to the second electrode 54 of the semiconductor element 5 and the wire bonding region 210 of the second lead 2. Accordingly, the second electrode 54 of the semiconductor element 5 is electrically connected to the second lead 2. The material of the bonding wire 71 is not specifically limited. In this embodiment, for example, a wire formed of Al is employed. The number of bonding wires 71 is not limited, either. The first terminal 120 of the first lead 1, electrically connected to the first electrode 53, acts as the cathode terminal of the semiconductor device A1, and the second terminal 220 of the second lead 2, electrically connected to the second electrode 54, acts as the anode terminal of the semiconductor device A1.

The sealing resin 8 covers a part of each of the first lead 1 and the second lead 2, the semiconductor element 5, and the bonding wire 71. The sealing resin 8 is, for example, formed of a black epoxy resin.

The sealing resin 8 includes a resin main face 81, a resin back face 82, resin side faces 83, and a resin end face 84. The resin main face 81 and the resin back face 82 are arranged to face in opposite directions to each other, in the z-direction. The resin main face 81 faces to the left in FIG. 6 to FIG. 8, and the resin back face 82 faces to the right in FIG. 6 to FIG. 8. As shown in FIG. 2, FIG. 5, FIG. 7, and FIG. 8, the mounting base back face 112 of the first lead 1 is entirely exposed from the resin back face 82, and the resin back face 82 and the mounting base back face 112 are flush with each other.

The resin side faces 83 includes a pair of faces oriented in the x-direction, each connected to the resin main face 81 and the resin back face 82. The pair of resin side faces 83 are arranged to face in opposite directions to each other. The resin side faces 83 each include a first side face 831 and a second side face 832. As shown in FIG. 1 and FIG. 2, the first side faces 831 are connected to the resin main face 81, and inclined so as to be closer to each other, toward the resin main face 81. The second side faces 832 are connected to the resin back face 82, and inclined so as to be closer to each other, toward the resin back face 82. In this embodiment, the boundary between the first side face 831 and the second side face 832 is located closer to the resin back face 82.

The resin end face 84 is connected to the resin main face 81 and the resin back face 82, and arranged to face in the direction in which the first terminal 120 and the second terminal 220 protrude (downward in the y-direction in FIG. 3). The resin end face 84 is connected to each of the pair of resin side faces 83. The resin end face 84 includes a first end face 841 and a second end face 842. As shown in FIG. 1, FIG. 2, and FIG. 6, the first end face 841 of the resin end face 84 is connected to the resin main face 81, and inclined so as to be closer to the center of the sealing resin 8, toward the resin main face 81. The second end face 842 is connected to the resin back face 82, and inclined so as to be closer to the center of the sealing resin 8, toward the resin back face 82. Thus, the portion of the sealing resin 8 surrounded by the pair of first side faces 831 and the first end face 841 have a tapered shape, formed such that the cross-sectional area along the xy-plane decreases toward the resin main face 81, and the portion surrounded by the pair of second side faces 832 and the second end face 842 have a tapered shape, formed such that the cross-sectional area along the xy-plane decreases as proceeding toward the resin back face 82.

In this embodiment, the sealing resin 8 includes a resin through-hole 891, a side face recess 892, end face protrusions 85 and 86, and a back face groove 87.

The resin through-hole 891 is formed throughout between the resin main face 81 and the resin back face 82, parallel to the z-direction. The resin through-hole 891 is located at the central position of the sealing resin 8 in the x-direction and on the side of an end portion in the y-direction (upper side in FIG. 3), and has a circular shape as viewed in the z-direction. In this embodiment, the resin through-hole 891 is concentric with the mounting base through-hole 113. The resin through-hole 891 is smaller in diameter than the mounting base through-hole 113. Accordingly, as shown in FIG. 2 and FIG. 5, the resin through-hole 891 is located inside the mounting base through-hole 113, and the inner wall of the resin through-hole 891 is entirely constituted of the sealing resin 8. In other words, the mounting base 110 is not exposed from the inner wall of the resin through-hole 891. The resin through-hole 891 is utilized, for example, to insert a fastening member such as a screw to thereby attach a heat dissipation material to the semiconductor device A1. When the mounting base back face 112 is connected to the heat dissipation material via an electric insulation sheet, heat generated from the semiconductor element 5 is discharged through the mounting base 110 and the heat dissipation material.

The side face recess 892 is formed in each of the first side faces 831 of the resin side face 83, so as to recede from the first side face 831 and the resin main face 81. In this embodiment, the side face recesses 892 have a semicircular shape as viewed in the z-direction, and located on the respective sides of the resin through-hole 891. As shown in FIG. 1 and FIG. 3, a part of the mounting base main face 111 of the first lead 1 is exposed from the sealing resin 8, because of the presence of the side face recess 892. As shown in FIG. 6 and FIG. 7, the side face recesses 892 each have a tapered shape, formed such that the cross-sectional area along the xy-plane increases toward the resin main face 81. The shape and the location of the side face recess 892 are not limited to the illustrated example.

The end face protrusions 85 and 86 each protrude in the y-direction from the resin end face 84, and have a generally rectangular block shape. The shape of the end face protrusions 85 and 86 is not specifically limited and may be, for example, a circular column shape. The end face protrusion 85 and the end face protrusion 86 are spaced apart from each other in the x-direction. The first terminal 120 of the first lead 1 protrudes from the end face protrusion 85, and the second terminal 220 of the second lead 2 protrudes from the end face protrusion 86. The end face protrusion 86 exemplifies the end face protrusion in the present disclosure, and the end face protrusion 85 exemplifies the second end face protrusion in the present disclosure.

The back face groove 87 is a groove extending along the x-direction, formed so as to recede from the resin back face 82, and has a rectangular cross-section along the yz-plane. The cross-section parallel to the first side face 831 or second side face 832 is also rectangular. As shown in FIG. 2, FIG. 5, and FIG. 6, the back face groove 87 includes a groove bottom face 871 and a pair of groove side faces 872. The groove bottom face 871 is parallel to the resin back face 82, and located on the side of the resin main face 81 with respect to the resin back face 82. The pair of groove side faces 872 are each connected to the groove bottom face 871 and the resin back face 82, and opposed to each other. The back face groove 87 is formed such that the cross-sectional area along the xy-plane becomes larger toward the resin back face 82. The pair of groove side faces 872 are each inclined by 3 to 5 degrees, with respect to the xz-plane. The inclination of the groove side faces 872 is not limited to the illustrated example, and it is not mandatory that the groove side faces 872 are inclined. The depth (size in the z-direction) of the back face groove 87 is, for example, approximately 1 mm, and the width (size in the y-direction) of the back face groove 87 is, for example, approximately 1 mm.

The back face groove 87 is located between an edge (lower edge in FIG. 5) of the resin back face 82 in the y-direction and the mounting base back face 112 as viewed in the z-direction. The back face groove 87 has an end extending as far as the resin side face 83 on the side of the second terminal 220, and forming an opening at the resin side face 83. The other end of the back face groove 87 extends to a proximity of the center of the resin back face 82 in the x-direction. In the illustrated example, the back face groove 87 has an elongate shape in the x-direction, which ends before the first lead 1. In this embodiment, the back face groove 87 is located between the boundary between the second terminal 220 and the resin end face 84, and the mounting base back face 112. The back face groove 87 does not overlap with the first lead 1 as viewed in the z-direction. The back face groove 87 includes the groove bottom face 871, deviated from the resin back face 82 in the z-direction toward the resin main face 81. The back face groove 87 exemplifies the back face displaced portion in the present disclosure.

The semiconductor device A1 provides the following advantageous effects.

In this embodiment, the sealing resin 8 includes the back face groove 87 recessed from the resin back face 82. Accordingly, the creepage distance (distance measured along the surface of the sealing resin 8) between the portion of the second terminal 220 exposed from the sealing resin 8 and the mounting base back face 112 can be prolonged, compared with the case where the back face groove 87 is not formed. The longer the creepage distance is, the higher withstand voltage can be attained, between the second terminal 220 and the mounting base back face 112. Consequently, the semiconductor device A1 can obtain a higher withstand voltage.

In this embodiment, the sealing resin 8 includes the end face protrusion 86 protruding from the resin end face 84, and the second terminal 220 protrudes from the end face protrusion 86. Accordingly, the creepage distance between the portion of the second terminal 220 exposed from the sealing resin 8 and the mounting base back face 112 can be prolonged, by a distance corresponding to the size of the end face protrusion 86 in the y-direction. Therefore, the withstand voltage between the second terminal 220 and the mounting base back face 112 can be further improved. In addition, the end face protrusion 86 also serves to increase the creepage distance between the first terminal 120 and the second terminal 220. Accordingly, the withstand voltage between the first terminal 120 and the second terminal 220 can be improved. In this embodiment, further, the sealing resin 8 includes the end face protrusion 85 protruding from the resin end face 84, and the first terminal 120 protrudes from the end face protrusion 85. Therefore, the creepage distance between the first terminal 120 and the second terminal 220 can be further prolonged, by a distance corresponding to the size of the end face protrusion 85 in the y-direction. Consequently, the withstand voltage between the first terminal 120 and the second terminal 220 can be further improved.

Figure 9:
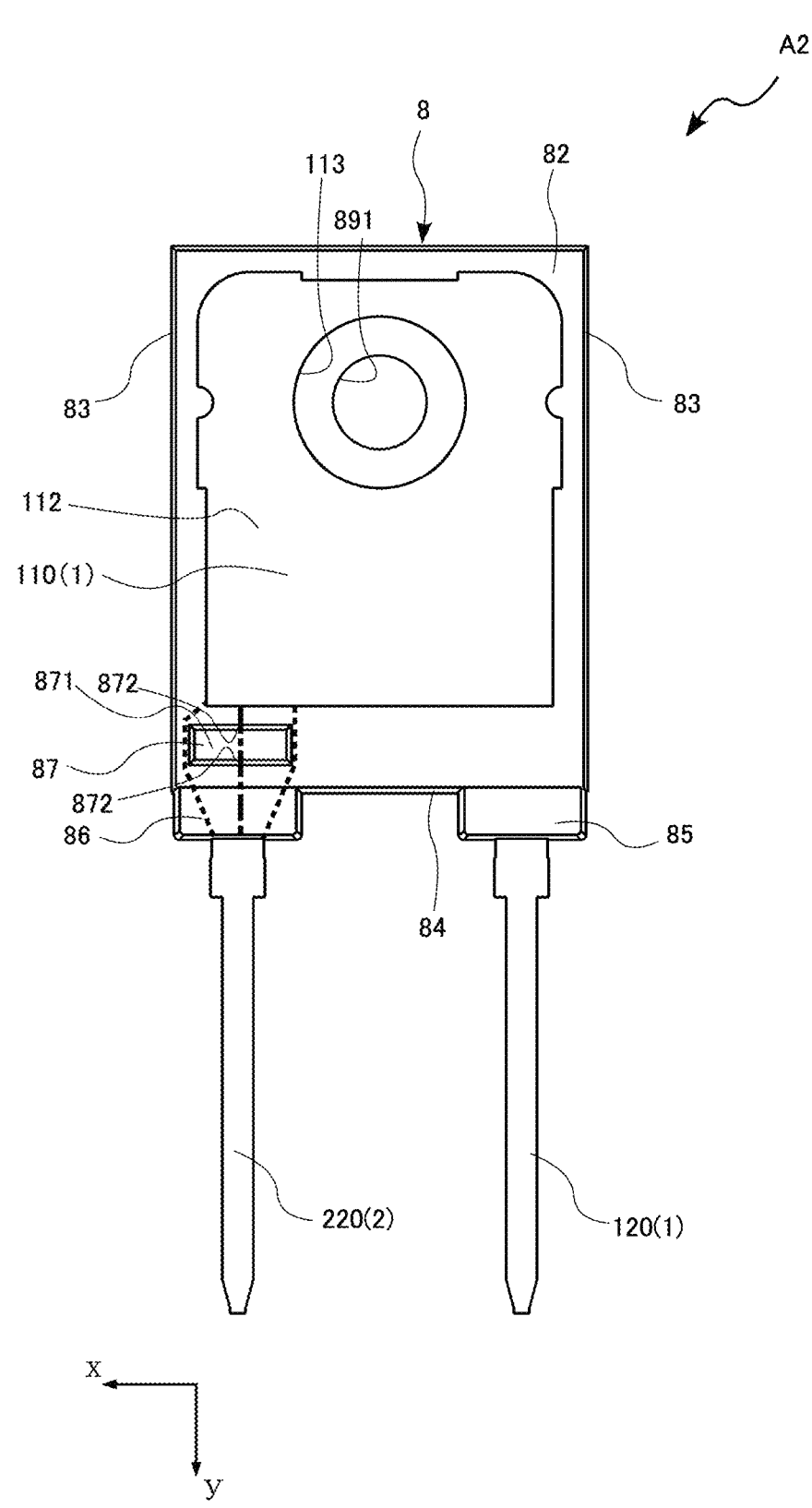
FIG. 9 is a bottom view showing a semiconductor device according to a second embodiment.

Referring now to FIG. 9, a semiconductor device A2 according to a second embodiment will be described hereunder. In FIG. 9, the elements same as or similar to those of the semiconductor device A1 are given the same numeral, and the description thereof will not be repeated. FIG. 9 is a bottom view showing the semiconductor device A2, and corresponds to FIG. 5 showing the semiconductor device A1 according to the first embodiment.

The semiconductor device A2 is different from the semiconductor device A1, in the shape of the back face groove 87. In this embodiment, the back face groove 87 is smaller in size in the x-direction. An end of the back face groove 87 does not reach the resin side face 83 on the side of the second terminal 220, and therefore the back face groove 87 is not open at the resin side face 83. The other end of the back face groove 87 does not reach the proximity of the center of the resin back face 82 in the x-direction, but only as far as a position closer to the resin side face 83 on the side of the second terminal 220, in comparison with the first embodiment. The back face groove 87 is formed such that the creepage distance from the second terminal 220 to the mounting base back face 112 circumventing the back face groove 87 (indicated by broken lines in FIG. 9) becomes longer than the creepage distance across the back face groove 87 (indicated by a dash-dot line in FIG. 9).

In this embodiment also, the creepage distance between the portion of the second terminal 220 exposed from the sealing resin 8 and the mounting base back face 112 can be prolonged. Therefore, this embodiment provides similar advantageous effects to those provided by the first embodiment. Here, even when the creepage distance from the second terminal 220 to the mounting base back face 112 circumventing the back face groove 87 is shorter than the creepage distance across the back face groove 87, the creepage distance between the portion of the second terminal 220 exposed from the sealing resin 8 and the mounting base back face 112 can be prolonged, compared with the case where the back face groove 87 is not formed. Therefore, even with the mentioned configuration, the back face groove 87 contributes to improving the withstand voltage of the semiconductor device A2.

Figure 10:
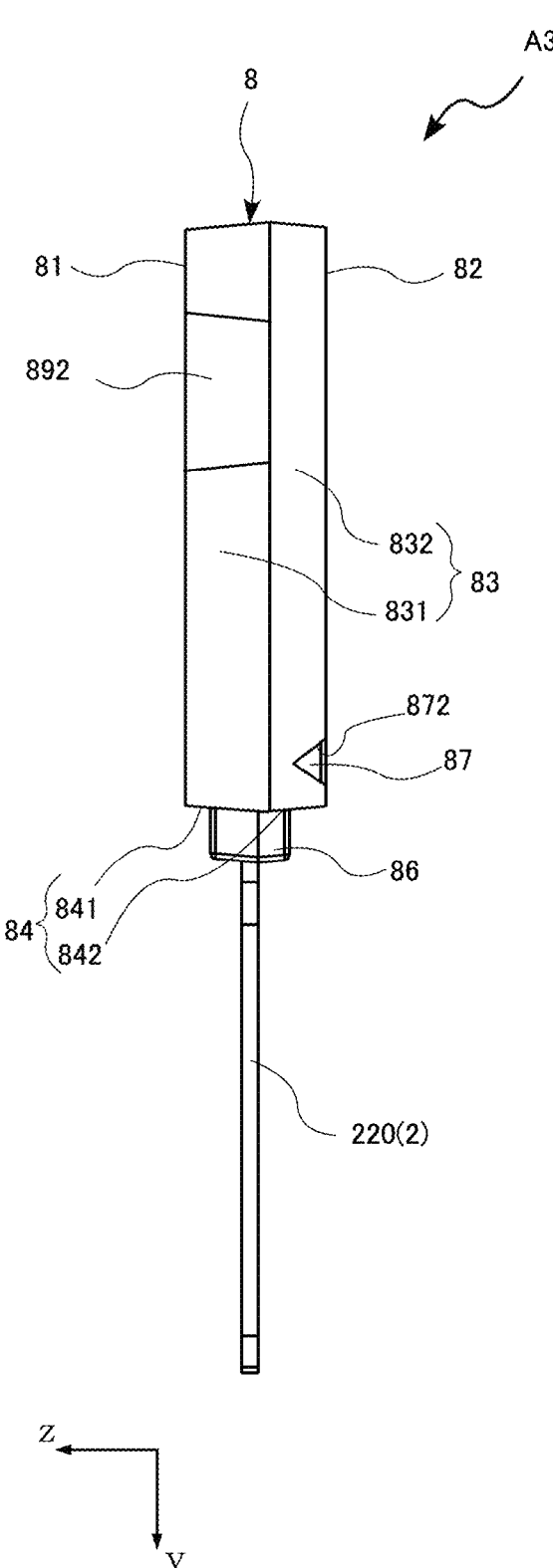
FIG. 10 is a right-side view showing a semiconductor device according to a third embodiment.

Referring to FIG. 10, a semiconductor device A3 according to a third embodiment will be described hereunder. In FIG. 10, the elements same as or similar to those of the semiconductor device A1 are given the same numeral, and the description thereof will not be repeated. FIG. 10 is a right-side view showing the semiconductor device A3, and corresponds to FIG. 6 showing the semiconductor device A1 according to the first embodiment.

The semiconductor device A3 is different from the semiconductor device A1, in the shape of the back face groove 87. In this embodiment, the back face groove 87 has a triangular cross-section, along the yz-plane. In this embodiment also, the creepage distance between the portion of the second terminal 220 exposed from the sealing resin 8 and the mounting base back face 112 can be prolonged. Therefore, this embodiment also provides similar advantageous effects to those provided by the first embodiment. The cross-sectional shape of the back face groove 87 along the yz-plane is not limited to the illustrated example, but may be any desired shape, for example a semicircular shape.

Figure 11:
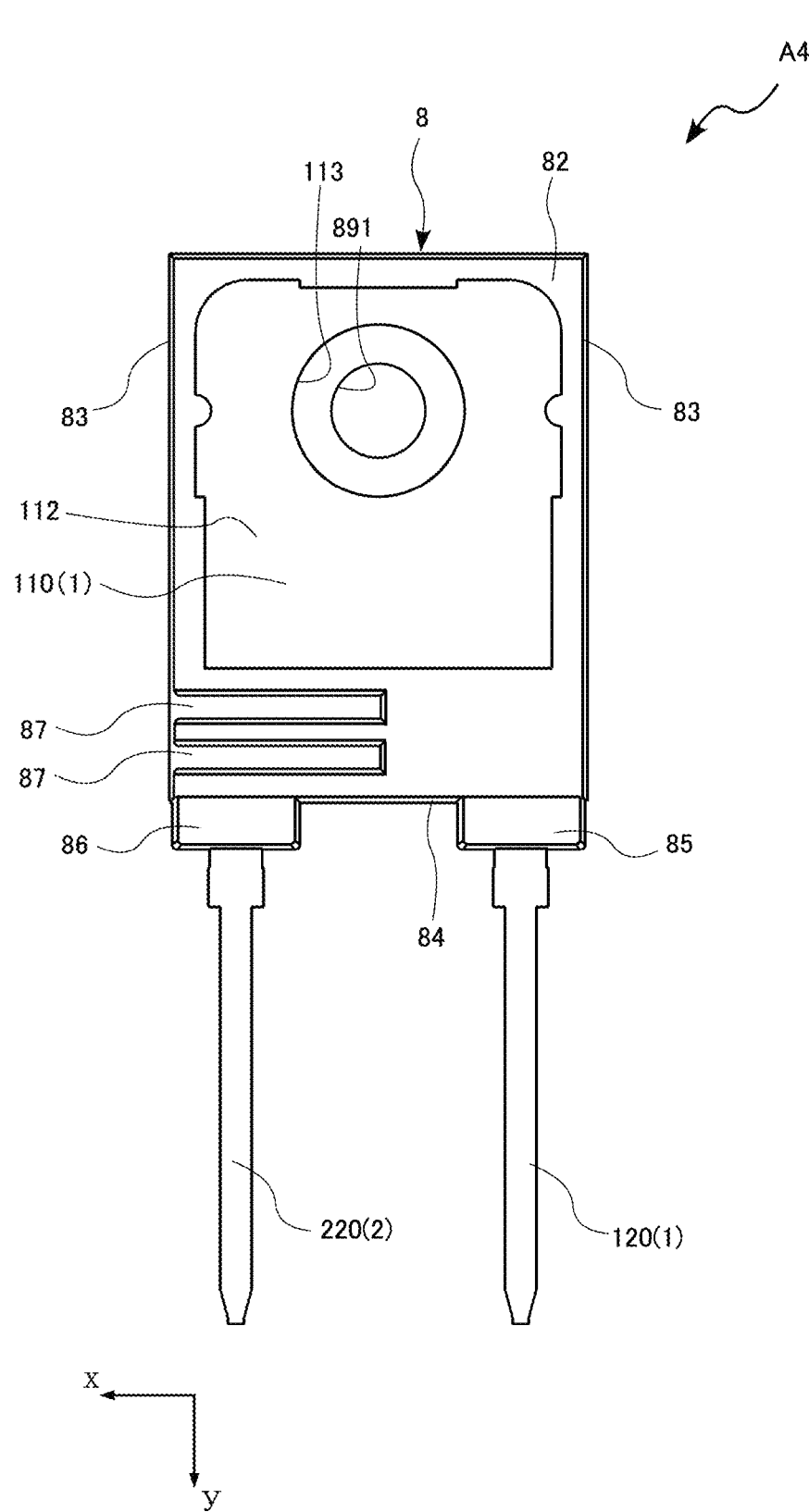
FIG. 11 is a bottom view showing a semiconductor device according to a fourth embodiment.

Referring to FIG. 11, a semiconductor device A4 according to a fourth embodiment will be described hereunder. In FIG. 11, the elements same as or similar to those of the semiconductor device A1 are given the same numeral, and the description thereof will not be repeated. FIG. 11 is a bottom view showing the semiconductor device A4, and corresponds to FIG. 5 showing the semiconductor device A1 according to the first embodiment.

The semiconductor device A4 is different from the semiconductor device A1, in including two back face grooves 87. In this embodiment, the sealing resin 8 includes two back face grooves 87, aligned in the y-direction. With the configuration according to this embodiment, the creepage distance between the portion of the second terminal 220 exposed from the sealing resin 8 and the mounting base back face 112 can be further prolonged, compared with the case where a single back face groove 87 is formed. Therefore, this embodiment also provides similar advantageous effects to those provided by the first embodiment. The number of the back face grooves 87 is not specifically limited, and may be three or more.

Figure 12:
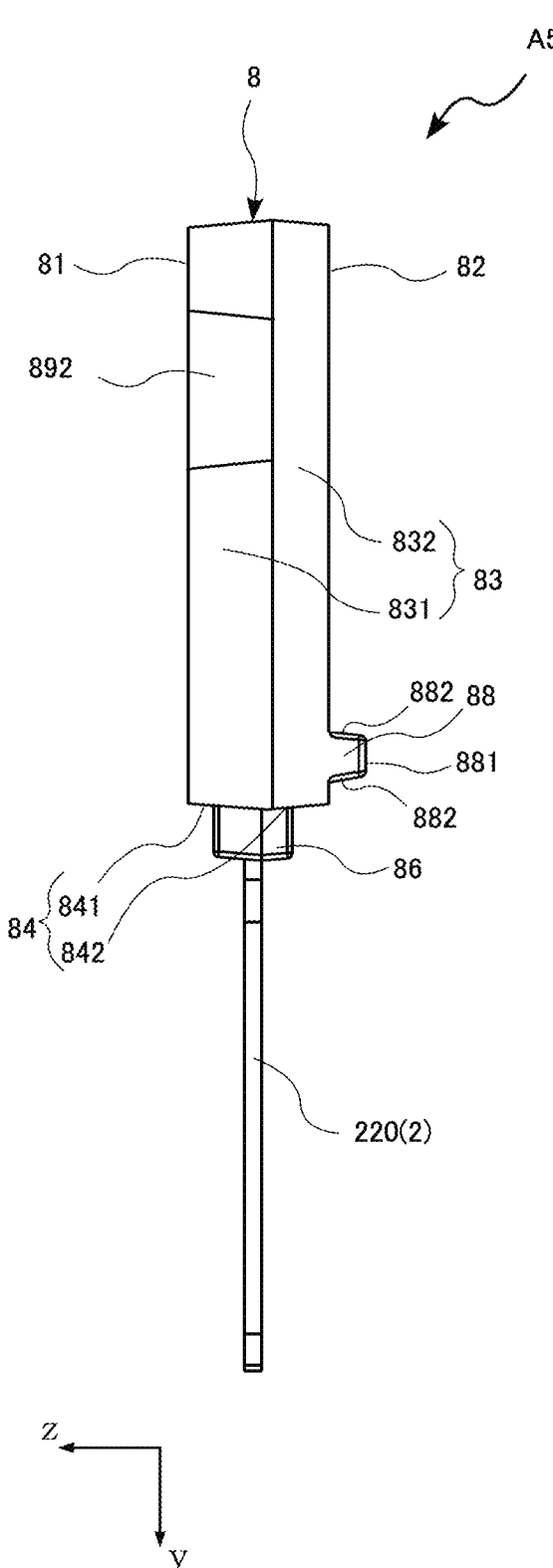
FIG. 12 is a right-side view showing a semiconductor device according to a fifth embodiment.

Referring to FIG. 12, a semiconductor device A5 according to a fifth embodiment will be described hereunder. In FIG. 12, the elements same as or similar to those of the semiconductor device A1 are given the same numeral, and the description thereof will not be repeated. FIG. 12 is a right-side view showing the semiconductor device A5, and corresponds to FIG. 6 showing the semiconductor device A1 according to the first embodiment.

The semiconductor device A5 is different from the semiconductor device A1 in including a back face protrusion 88, in place of the back face groove 87.

The back face protrusion 88 is formed so as to protrude from the resin back face 82, in an elongate shape extending in the x-direction. The back face protrusion 88 has a rectangular cross-section along the yz-plane. The cross-section of the back face protrusion 88 parallel to the first side face 831 or second side face 832 is also rectangular. The back face protrusion 88 includes a protrusion main face 881 and a pair of protrusion side faces 882. The protrusion main face 881 is parallel to the resin back face 82, and located on the opposite side of the resin main face 81, with respect to the resin back face 82. The pair of protrusion side faces 882 are each connected to the protrusion main face 881 and the resin back face 82, and oriented in opposite directions to each other. The back face protrusion 88 is formed in a tapered shape, such that the cross-sectional area along the xy-plane becomes smaller in the direction away from the resin back face 82. The pair of protrusion side faces 882 are each inclined by 3 to 5 degrees, with respect to the xz-plane. The inclination of the protrusion side faces 882 is not limited to the illustrated example, and it is not mandatory that the protrusion side faces 882 are inclined. The height (size in the z-direction) of the back face protrusion 88 is, for example, approximately 1 mm, and the width (e.g., average, maximum value, or minimum value of the size in the y-direction) of the back face protrusion 88 is, for example, approximately 1 mm.

The size of the back face protrusion 88 in the x-direction and the location thereof in a z-direction view are similar to those of the back face groove 87 in the first embodiment. More specifically, the back face protrusion 88 is located between an edge of the resin back face 82 in the y-direction and the mounting base back face 112 as viewed in the z-direction. The back face protrusion 88 has an end extending as far as the resin side face 83 on the side of the second terminal 220, and the other end of the back face protrusion 88 extends to a proximity of the center of the resin back face 82 in the x-direction. Thus, the back face protrusion 88 is located between the boundary between the second terminal 220 and the resin end face 84, and the mounting base back face 112. The back face protrusion 88 does not overlap with the first lead 1 as viewed in the z-direction. The back face protrusion 88 includes the protrusion main face 881, deviated from the resin back face 82 in the z-direction toward the opposite side of the resin main face 81. The back face protrusion 88 exemplifies the back face displaced portion in the present disclosure.

In this embodiment, the sealing resin 8 includes the back face protrusion 88 formed so as to protrude from the resin back face 82. Accordingly, the creepage distance between the portion of the second terminal 220 exposed from the sealing resin 8 and the mounting base back face 112 can be prolonged. Therefore, this embodiment also provides similar advantageous effects to those provided by the first embodiment.

The cross-sectional shape of the back face protrusion 88 along the yz-plane is not specifically limited, but may be any desired shape, for example a triangular or semicircular shape. The sealing resin 8 may include a plurality of back face protrusions 88 aligned in the y-direction.

Figure 13:
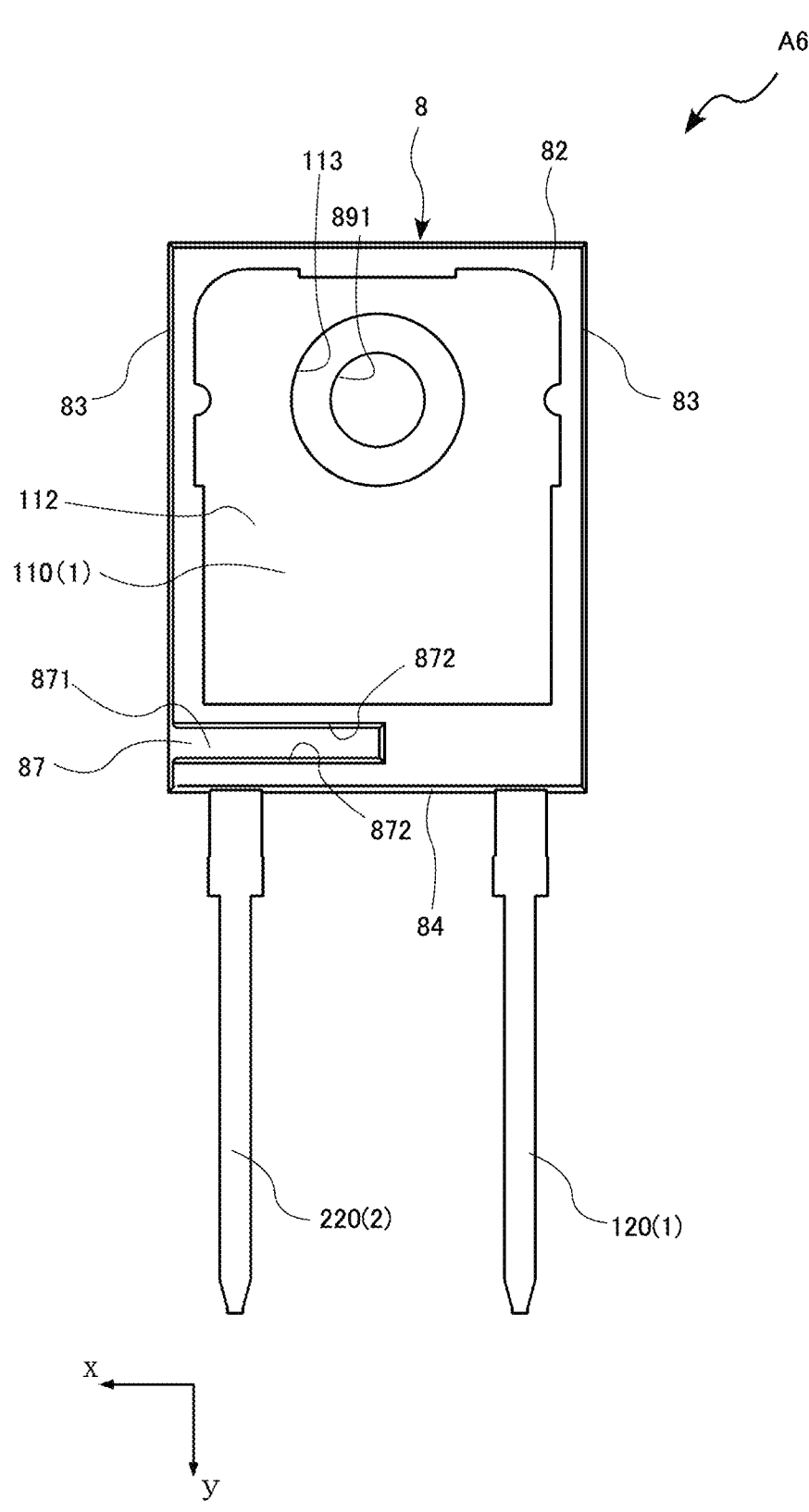
FIG. 13 is a bottom view showing a semiconductor device according to a sixth embodiment.

Referring to FIG. 13, a semiconductor device A6 according to a sixth embodiment will be described hereunder. In FIG. 13, the elements same as or similar to those of the semiconductor device A1 are given the same numeral, and the description thereof will not be repeated. FIG. 13 is a bottom view showing the semiconductor device A6, and corresponds to FIG. 5 showing the semiconductor device A1.

The semiconductor device A6 is different from the semiconductor device A1, in not including the end face protrusions 85 and 86. In this embodiment, the first terminal 120 and the second terminal 220 protrude from the resin end face 84.

Since the sealing resin 8 includes the back face groove 87 in this embodiment also, the creepage distance between the portion of the second terminal 220 exposed from the sealing resin 8 and the mounting base back face 112 can be prolonged. Therefore, the withstand voltage of the semiconductor device A6 can also be improved.

Figure 14:
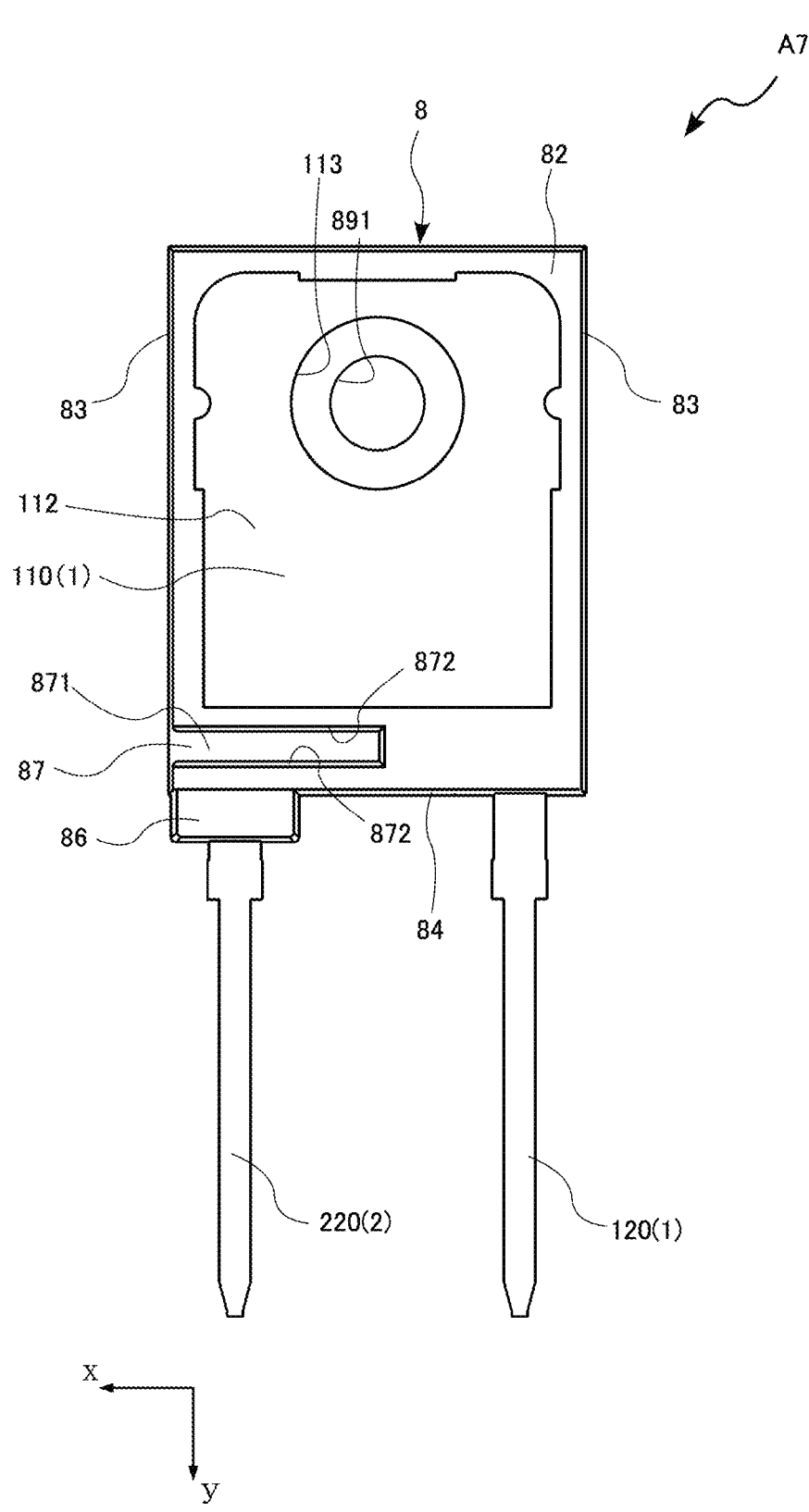
FIG. 14 is a bottom view showing a semiconductor device according to a seventh embodiment.

Referring to FIG. 14, a semiconductor device A7 according to a seventh embodiment will be described hereunder. In FIG. 14, the elements same as or similar to those of the semiconductor device A1 are given the same numeral, and the description thereof will not be repeated. FIG. 14 is a bottom view showing the semiconductor device A7, and corresponds to FIG. 5 showing the semiconductor device A1.

The semiconductor device A7 is different from the semiconductor device A1, in not including the end face protrusion 85. In this embodiment, the first terminal 120 protrudes from the resin end face 84.

Since the sealing resin 8 includes the back face groove 87 in this embodiment also, the creepage distance between the portion of the second terminal 220 exposed from the sealing resin 8 and the mounting base back face 112 can be prolonged. Therefore, the withstand voltage of the semiconductor device A7 can also be improved. In addition, since the sealing resin 8 includes the end face protrusion 86 in this embodiment also, the creepage distance between the portion of the second terminal 220 exposed from the sealing resin 8 and the mounting base back face 112 can be prolonged. Therefore, the withstand voltage between the second terminal 220 and the mounting base back face 112 can be further improved. The end face protrusion 86 also serves to prolong the creepage distance between the first terminal 120 and the second terminal 220. Therefore, the withstand voltage between the first terminal 120 and the second terminal 220 can be improved.

Figure 15:
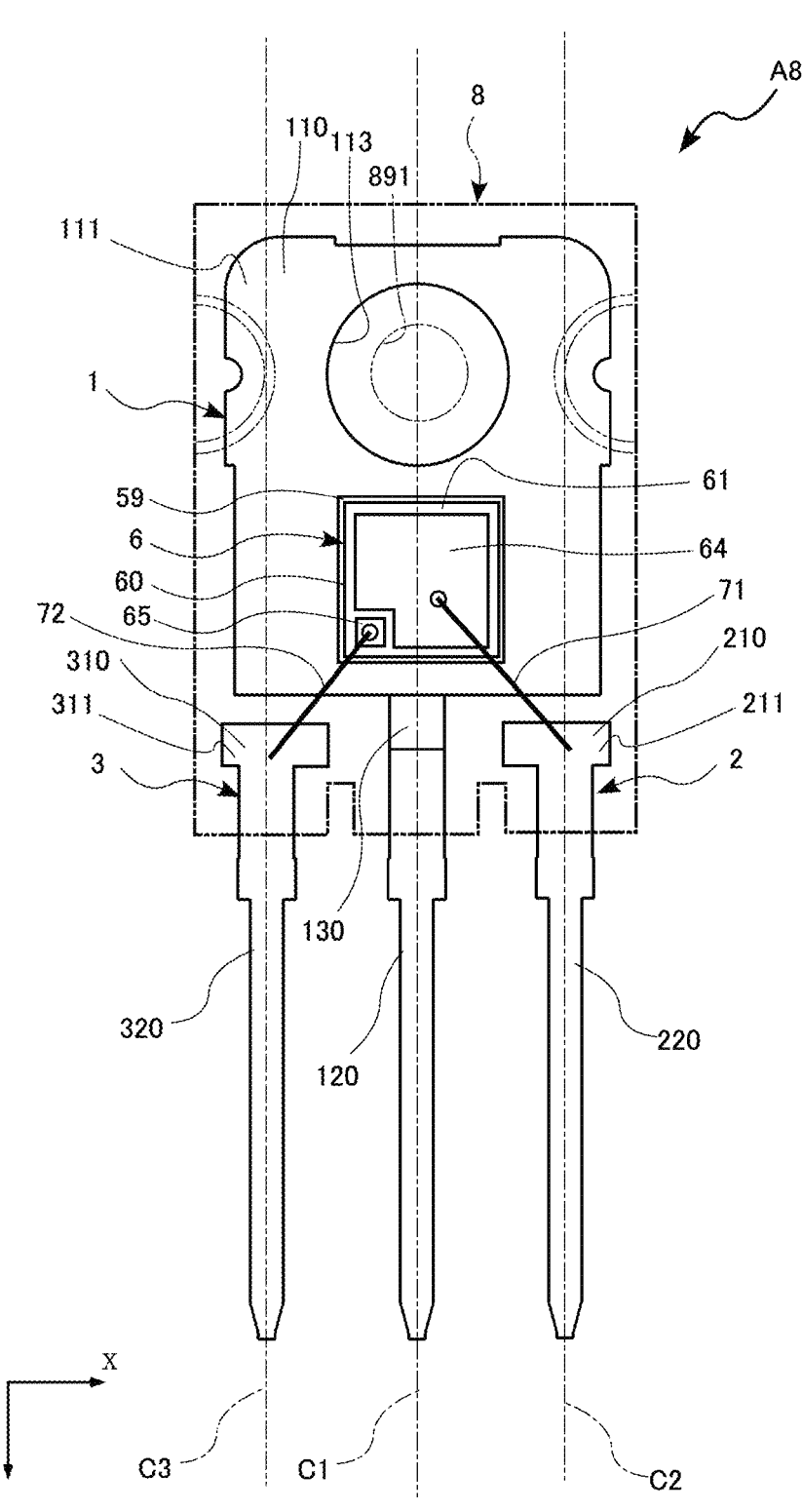
FIG. 15 is a plan view showing a semiconductor device according to an eighth embodiment, seen through a sealing resin.
Figure 16:
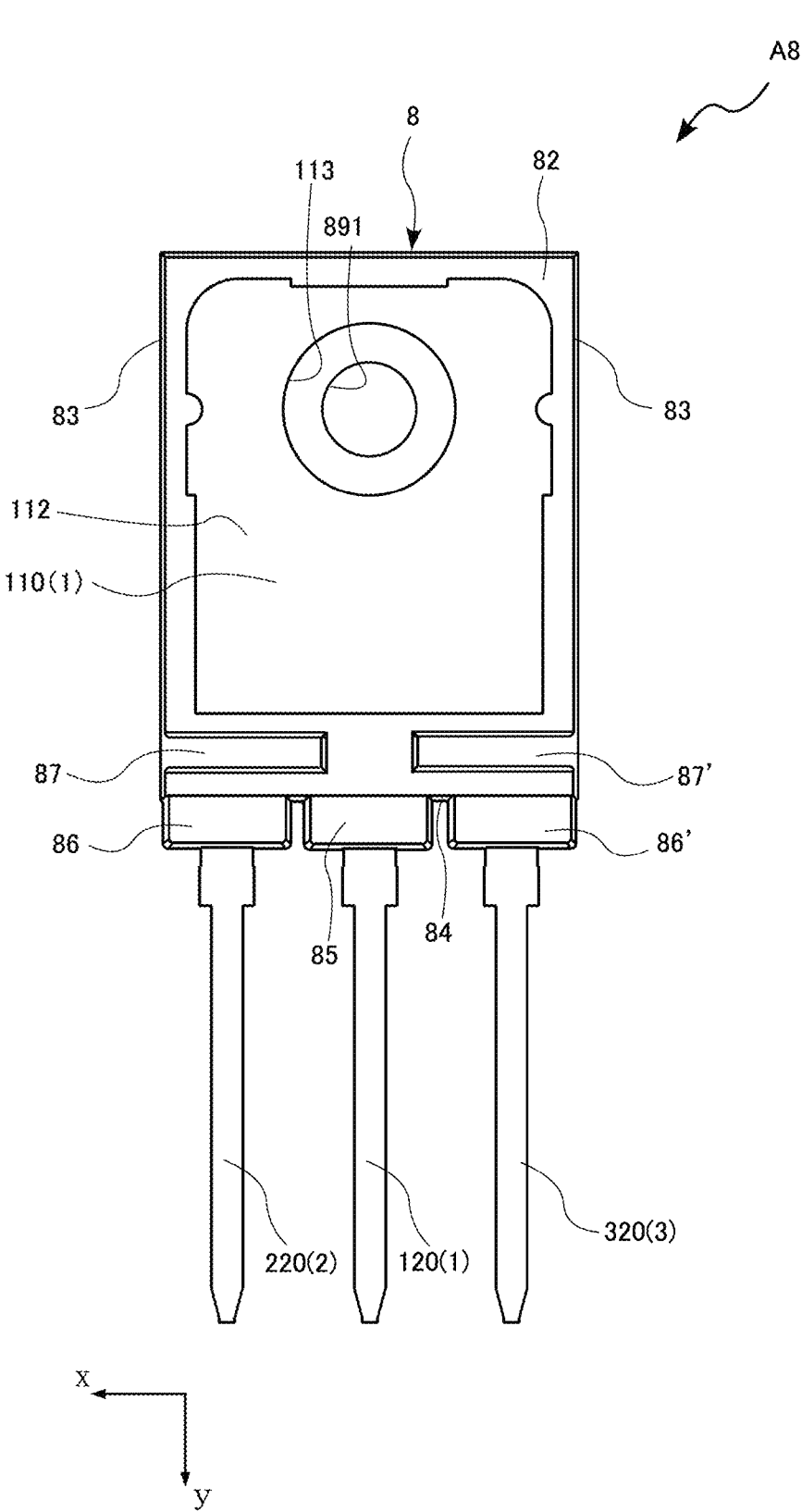
FIG. 16 is a bottom view showing the semiconductor device according to the eighth embodiment.

Referring to FIG. 15 and FIG. 16, a semiconductor device A8 according to an eighth embodiment will be described hereunder. In FIG. 15 and FIG. 16, the elements same as or similar to those of the semiconductor device A1 are given the same numeral, and the description thereof will not be repeated. FIG. 15 is a partial plan view showing the semiconductor device A8, and corresponds to FIG. 4 showing the semiconductor device A1 according to the first embodiment. FIG. 16 is a bottom view showing the semiconductor device A8, and corresponds to FIG. 5 showing the semiconductor device A1.

The semiconductor device A8 is different from the semiconductor device A1, in including the semiconductor element 6 in place of the semiconductor element 5. In addition, the semiconductor device A8 includes three terminals, in accordance with the number of electrodes of the semiconductor element 6. The semiconductor device A8 includes the first lead 1, the second lead 2, a third lead 3, the semiconductor element 6, bonding wires 71 and 72, and the sealing resin 8.

The first lead 1 and the second lead 2 are, like those of the first embodiment, electrically connected to the semiconductor element 6, to constitute the conduction path between the semiconductor element 6 and the circuit wiring, when the semiconductor device A8 is mounted on the circuit board. The joint portion 130 and the first terminal 120 of the first lead 1 according to this embodiment is located, as shown in FIG. 15, on the lower side of the mounting base 110 in the y-direction, and at the central portion in the x-direction. In this embodiment, an imaginary line C1 (dash-dot line) extended from the center line of the first terminal 120 in the y-direction intersects the semiconductor element 5 and the mounting base through-hole 113. The second lead 2 according to this embodiment is located, as shown in FIG. 15, on the lower side of the mounting base 110 of the first lead 1 in the y-direction, and on the right side in the x-direction. An imaginary line C2 (dash-dot line) extended from the center line of the second terminal 220 in the y-direction does not intersect the semiconductor element 5 and the mounting base through-hole 113.

The third lead 3 is, like the first lead 1 and the second lead 2, also electrically connected to the semiconductor element 6, to constitute the conduction path between the semiconductor element 6 and the circuit wiring, when the semiconductor device A8 is mounted on the circuit board. The material, size, and shape of the third lead 3 are similar to those of the second lead 2.

The third lead 3 is spaced apart from the first lead 1 and the second lead 2 and, as shown in FIG. 15, located on the lower side of the mounting base 110 of the first lead 1 in the y-direction, and on the left side in the x-direction. The third lead 3 includes a wire bonding region 310 and a third terminal 320.

The wire bonding region 310 is where the bonding wire 72 is to be bonded, and has a rectangular shape having the long sides extending in the x-direction as viewed in the z-direction. The wire bonding region 310 includes a wire bonding region main face 311 and a wire bonding region back face 312. The wire bonding region main face 311 and the wire bonding region back face 312 are arranged to face in opposite directions to each other, in the z-direction. The wire bonding region main face 311 faces to the front face of FIG. 15. The wire bonding region main face 311 is the face on which the bonding wire 72 is to be bonded. The wire bonding region back face 312 faces to the back face of FIG. 15. The wire bonding region 310 is entirely covered with the sealing resin 8.

The third terminal 320 is connected to the wire bonding region 310, and extends in the y-direction with a portion exposed from the sealing resin 8. The third terminal 320 is electrically connected to the semiconductor element 5, via the wire bonding region 310 and the bonding wire 72.

The wire bonding region 310 and the third terminal 320 have the same thickness (size in the z-direction), which is the same as that of the wire bonding region 210 and the second terminal 220 of the second lead 2. The portion of the third terminal 320 exposed from the sealing resin 8 has a similar shape to that of the respective portions of the first terminal 120 and the second terminal 220 exposed from the sealing resin 8. The distal end of the third terminal 320 (opposite to the end connected to the wire bonding region 310) is located at a similar position to the first terminal 120 and the second terminal 220, in the y-direction. In this embodiment, as shown in FIG. 15, an imaginary line C3 (dash-dot line) extended from the center line of the third terminal 320 in the y-direction does not intersect the semiconductor element 5 and the mounting base through-hole 113.

The semiconductor element 6 serves to perform the electrical functions of the semiconductor device A8. In this embodiment, the semiconductor element 6 is a transistor such as a metal-oxide-semiconductor field-effect transistor (MOSFET). The semiconductor element 6 includes an element main body 60, an element main face 61, an element back face (corresponding to the element back face 52 in FIG. 8), a first electrode (corresponding to the first electrode 53 in FIG. 8), a second electrode 64, and a third electrode 65.

The element main face 61 and the element back face are arranged to face in opposite directions to each other, in the z-direction. The element main face 61 faces to the front face of FIG. 15. The element back face faces to the back face of FIG. 15. The first electrode is located on the element back face. The second electrode 64 and the third electrode 65 are located on the element main face 61. In this embodiment, the first electrode is a drain electrode, the second electrode 64 is a source electrode, and the third electrode 65 is a gate electrode.

As shown in FIG. 15, the semiconductor element 6 is located at the center of the mounting base main face 111 in the x-direction, so as not to interfere with the mounting base through-hole 113 as viewed in the z-direction. The semiconductor element 6 is mounted on the mounting base main face 111 via the conductive bonding material 59, with the element back face facing to the mounting base main face 111. Accordingly, the first electrode of the semiconductor element 6 is bonded to the mounting base main face 111 via the bonding material 59, thus to be electrically connected to the first lead 1. The bonding wire 71 is connected to the second electrode 64 of the semiconductor element 6, and the wire bonding region main face 211 of the second lead 2. Accordingly, the second electrode 64 of the semiconductor element 6 is electrically connected to the second lead 2. The bonding wire 72 is connected to the third electrode 65 of the semiconductor element 6, and the wire bonding region main face 311 of the third lead 3. Accordingly, the third electrode 65 of the semiconductor element 6 is electrically connected to the third lead 3. The material, the thickness, and the number of the bonding wires 71 and 72 are not specifically limited. The first terminal 120 of the first lead 1 electrically connected to the first electrode acts as the drain terminal of the semiconductor device A8, the second terminal 220 of the second lead 2 electrically connected to the second electrode 64 acts as the source terminal of the semiconductor device A8, and the third terminal 320 of the third lead 3 electrically connected to the third electrode 65 acts as the gate terminal of the semiconductor device A8.

The sealing resin 8 according to this embodiment is configured similarly to the sealing resin 8 according to the first embodiment, but further includes an end face protrusion 86' and a back face groove 87'.

The end face protrusion 86' is, like the end face protrusions 85 and 86, protruding from the resin end face 84 in the y-direction, and has a generally rectangular block shape. In this embodiment, as shown in FIG. 16, the end face protrusion 85 is located at the center in the x-direction, the end face protrusion 86 is located on the left in the x-direction with a spacing from the end face protrusion 85, and the end face protrusion 86' is located on the right in the x-direction with a spacing from the end face protrusion 85, in accordance with the respective locations of the first terminal 120, the second terminal 220, and the third terminal 320. From the end face protrusion 86', the third terminal 320 of the third lead 3 protrudes.

The back face groove 87' is, like the back face groove 87, a groove extending along the x-direction, formed so as to recede from the resin back face 82. The shape and configuration of the back face groove 87' are similar to those of the back face groove 87. The back face groove 87' is located between an edge of the resin back face 82 in the y-direction (lower edge in FIG. 16) and the mounting base back face 112 as viewed in the z-direction. The back face groove 87' has an end extending as far as the resin side face 83 on the side of the third terminal 320, and forming an opening at the resin side face 83. The other end of the back face groove 87' extends to a proximity of the center of the resin back face 82 in the x-direction. In this embodiment, the other end of the back face groove 87 also extends to a proximity of the center of the resin back face 82 in the x-direction. Thus, the back face groove 87' is located between the boundary between the third terminal 320 and the resin end face 84, and the mounting base back face 112. In addition, the back face groove 87' does not overlap with the first lead 1 as viewed in the z-direction. The back face groove 87' includes a groove bottom face deviated from the resin back face 82 in the z-direction toward the resin main face 81, and exemplifies the second back face displaced portion in the present disclosure.

This embodiment also provides similar advantageous effects to those provided by the first embodiment. Further, in this embodiment the sealing resin 8 further includes the back face groove 87' formed so as to recede from the resin back face 82. Accordingly, the creepage distance between the portion of the third terminal 320 exposed from the sealing resin 8 and the mounting base back face 112 can be prolonged. Therefore, the withstand voltage between the third terminal 320 and the mounting base back face 112 can be improved.

In this embodiment, in addition, the sealing resin 8 further includes the end face protrusion 86' protruding from the resin end face 84, and the third terminal 320 protrudes from the end face protrusion 86'. Accordingly, the creepage distance between the portion of the third terminal 320 exposed from the sealing resin 8 and the mounting base back face 112 can be prolonged, by a distance corresponding to the size of the end face protrusion 86' in the y-direction. Therefore, the withstand voltage between the third terminal 320 and the mounting base back face 112 can be further improved. In addition, the end face protrusion 86' also serves to increase the creepage distance between the first terminal 120 and the third terminal 320. Accordingly, the withstand voltage between the first terminal 120 and the third terminal 320 can be improved.

Figure 17:
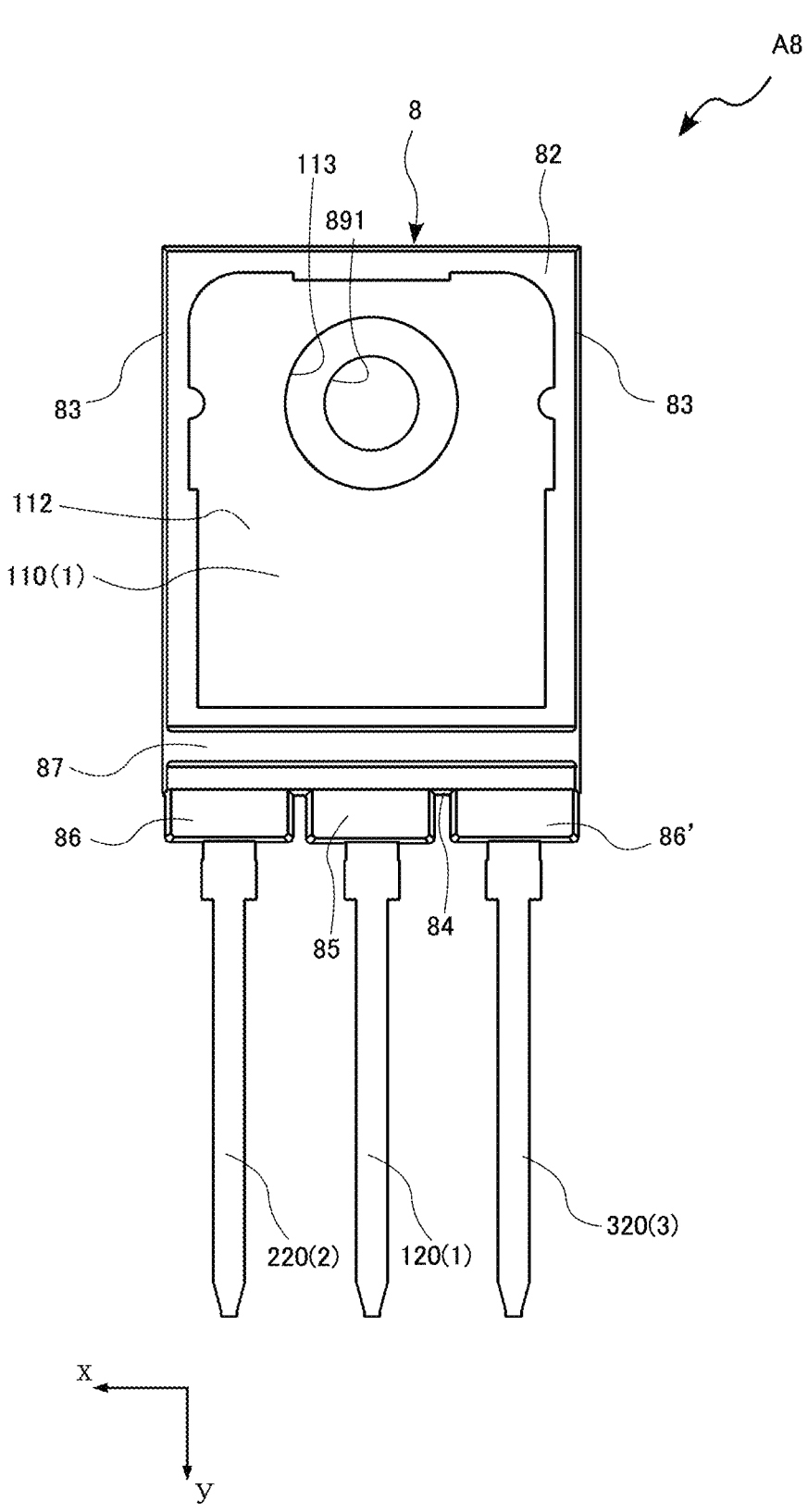
FIG. 17 is a bottom view showing a variation of the semiconductor device according to the eighth embodiment.

As a variation shown in FIG. 17, the other end of the back face groove 87 may be further extended so as to reach the resin side face 83 on the side of the third terminal 320, instead of forming the back face groove 87'.

Figure 18:
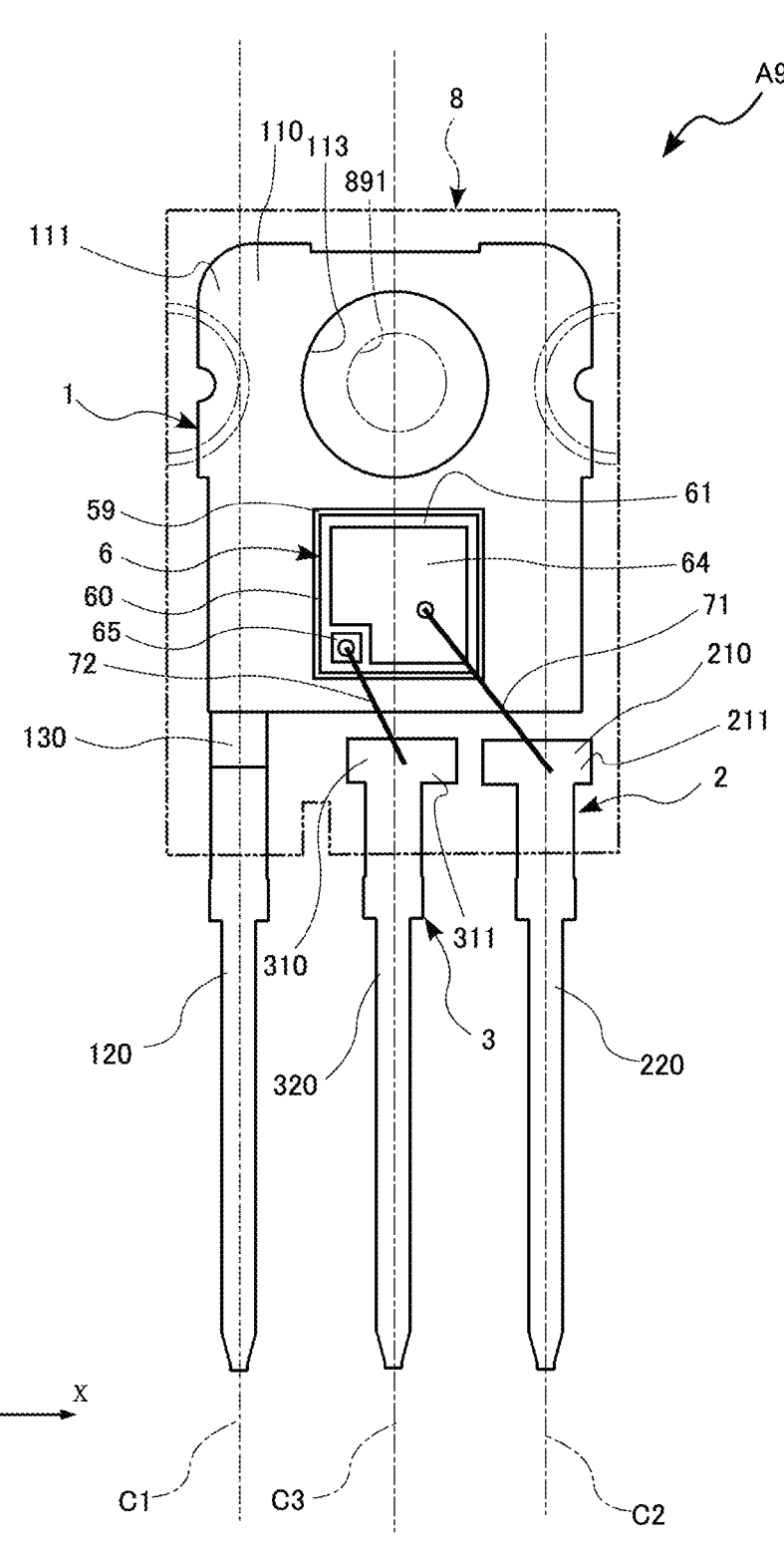
FIG. 18 is a plan view showing a semiconductor device according to a ninth embodiment, seen through a sealing resin.
Figure 19:
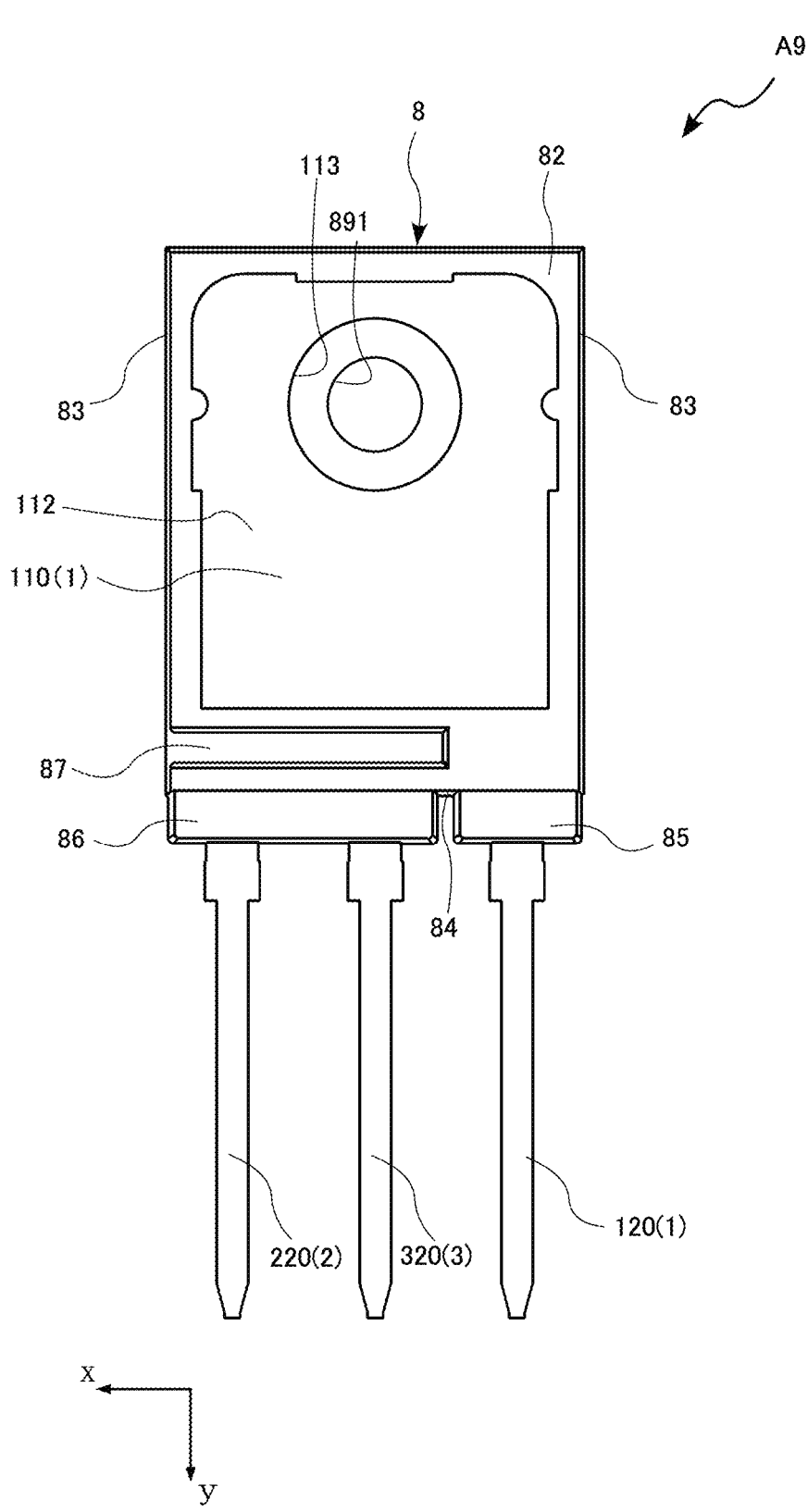
FIG. 19 is a bottom view showing the semiconductor device according to the ninth embodiment.

Referring to FIG. 18 and FIG. 19, a semiconductor device A9 according to a ninth embodiment will be described hereunder. In FIG. 18 and FIG. 19, the elements same as or similar to those of the semiconductor device A1 are given the same numeral, and the description thereof will not be repeated. FIG. 18 is a partial plan view showing the semiconductor device A9, and corresponds to FIG. 4 showing the semiconductor device A1 according to the first embodiment. FIG. 19 is a bottom view showing the semiconductor device A9, and corresponds to FIG. 5 showing the semiconductor device A1 according to the first embodiment.

The semiconductor device A9 according to this embodiment is different from the semiconductor device A8 according to the eighth embodiment, in the location of the first terminal 120 and the third terminal 320.

The location of the joint portion 130 and the first terminal 120 of the first lead 1, and the location of the second lead 2 according to this embodiment, are similar to those in the semiconductor device A1 according to the first embodiment. Specifically, the joint portion 130 and the first terminal 120 of the first lead 1 are located on the lower side of the mounting base 110 in the y-direction, and on the left in the x-direction, as shown in FIG. 18. An imaginary line C1 (dash-dot line) extended from the center line of the first terminal 120 in the y-direction does not intersect the semiconductor element 5 and the mounting base through-hole 113. In addition, the second lead 2 is located on the lower side of the mounting base 110 of the first lead 1 in the y-direction, and on the right in the x-direction, as shown in FIG. 18. An imaginary line C2 (dash-dot line) extended from the center line of the second terminal 220 in the y-direction does not intersect the semiconductor element 5 and the mounting base through-hole 113. The third lead 3 according to this embodiment is spaced apart from the first lead 1 and the second lead 2 and, as shown in FIG. 18, located on the lower side of the mounting base 110 of the first lead 1 in the y-direction, and at the center in the x-direction.

The sealing resin 8 according to this embodiment is different from that of the eighth embodiment in the shape of the end face protrusion 86, and is without the end face protrusion 86'. In addition, the locations of the end face protrusions 85 and 86 are different from those of the eighth embodiment. In this embodiment, as shown in FIG. 19, the end face protrusion 85 is located on the right in the x-direction, and the end face protrusion 86 is located on the left in the x-direction, with a spacing from the end face protrusion 85, in accordance with the locations of the first terminal 120, the second terminal 220, and the third terminal 320. The end face protrusion 86 is larger in size in the x-direction than in the eighth embodiment, and extends from the left end in the x-direction as far as a proximity of the end face protrusion 85. From the end face protrusion 86, the second terminal 220 of the second lead 2 and the third terminal 320 of the third lead 3 protrude.

The sealing resin 8 according to this embodiment is without the back face groove 87'. The back face groove 87 is larger in size in the x-direction than in the eighth embodiment, and the other end of the back face groove 87 extends to a position between the end face protrusion 85 and the end face protrusion 86. In other words, the back face groove 87 extends to the position between the boundary between the third terminal 320 and the resin end face 84, and the mounting base back face 112. The back face groove 87 does not overlap with the first lead 1 as viewed in the z-direction.

This embodiment also provides similar advantageous effects to those provided by the first embodiment. Further, in this embodiment the back face groove 87 extends to the position between the end face protrusion 85 and the end face protrusion 86. Accordingly, the creepage distance between the portion of the third terminal 320 exposed from the sealing resin 8 and the mounting base back face 112 can be prolonged. Consequently, the withstand voltage between the third terminal 320 and the mounting base back face 112 can be improved.

In this embodiment, the third terminal 320 protrudes from the end face protrusion 86. Accordingly, the creepage distance between the portion of the third terminal 320 exposed from the sealing resin 8 and the mounting base back face 112 can be prolonged, by a distance corresponding to the size of the end face protrusion 86 in the y-direction. Therefore, the withstand voltage between the third terminal 320 and the mounting base back face 112 can be further improved. The end face protrusion 86 also serves to increase the creepage distance between the first terminal 120 and the third terminal 320. Accordingly, the withstand voltage between the first terminal 120 and the third terminal 320 can be improved.

Figure 20:
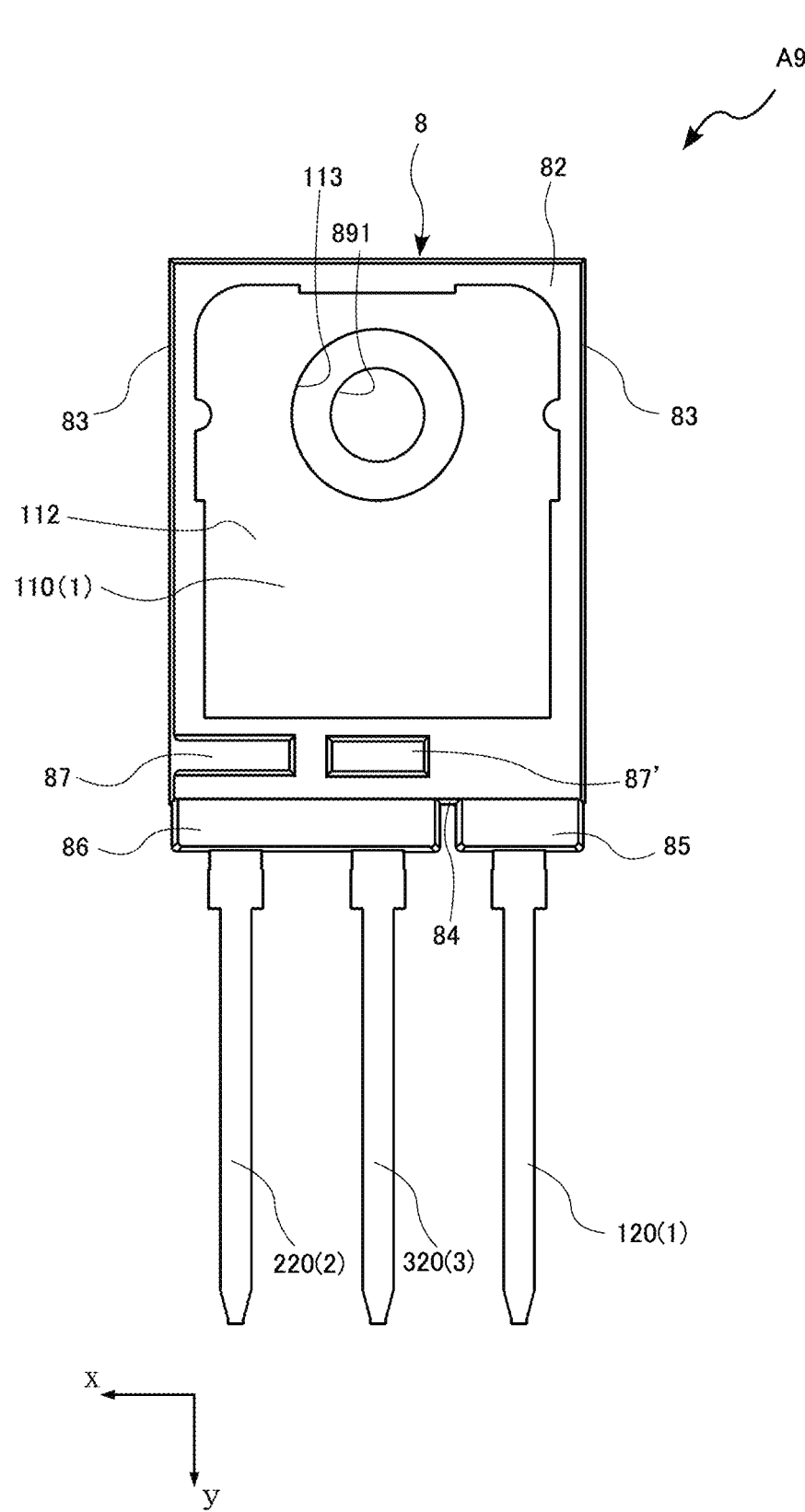
FIG. 20 is a bottom view showing a variation of the semiconductor device according to the ninth embodiment.

As a variation shown in FIG. 20, the back face groove 87 may be located between the boundary between the second terminal 220 and the resin end face 84, and the mounting base back face 112, and the back face groove 87' may be located between the boundary between the third terminal 320 and the resin end face 84, and the mounting base back face 112, instead of extending the back face groove 87. In this case, the back face groove 87' includes a groove bottom face deviated from the resin back face 82 in the z-direction toward the resin main face 81. The back face groove 87' exemplifies the second back face displaced portion in the present disclosure.

Figure 21:
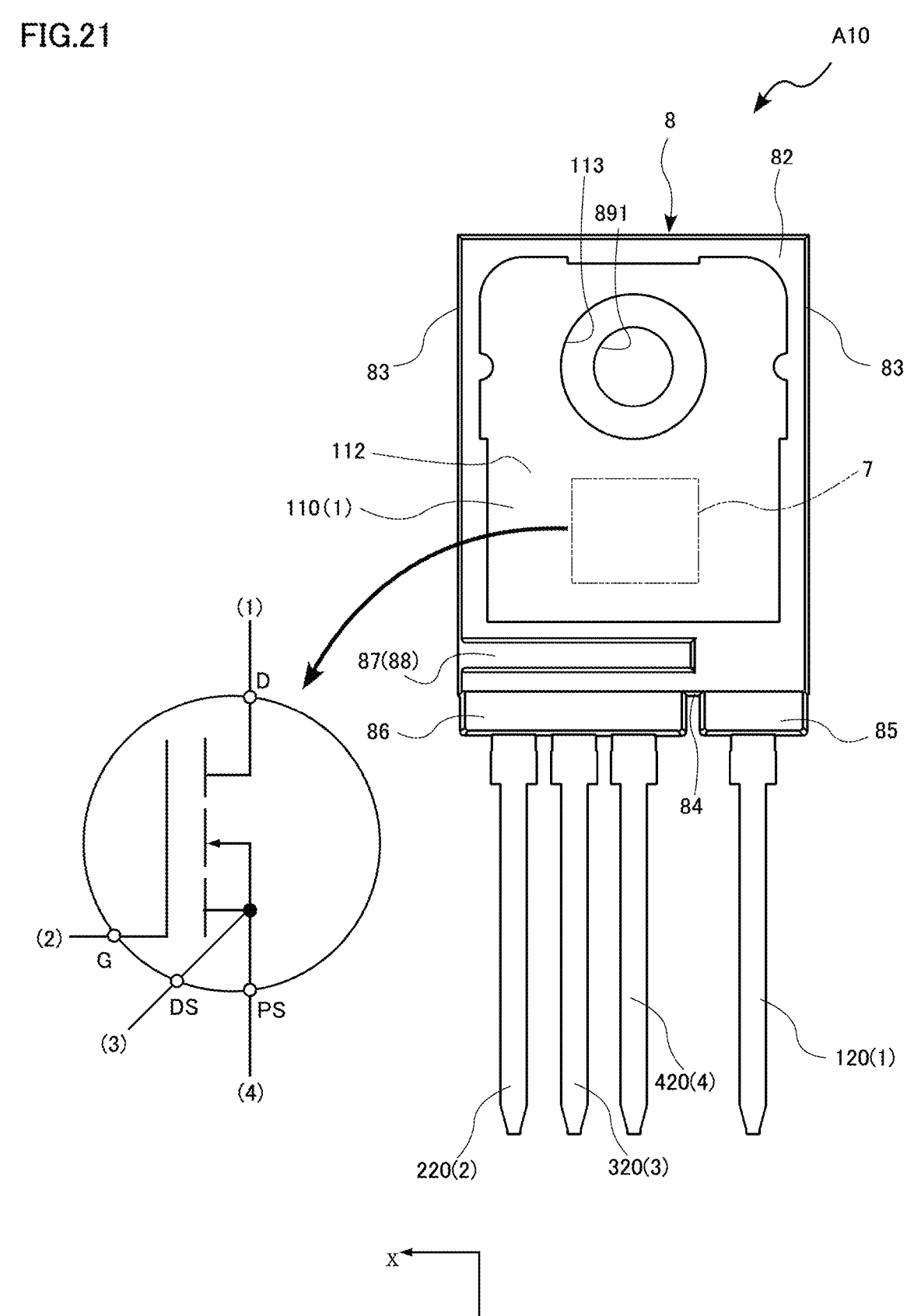
FIG. 21 is a bottom view showing a semiconductor device according to a tenth embodiment.

Referring to FIG. 21, a semiconductor device A10 according to a tenth embodiment will be described hereunder. In FIG. 21, the elements same as or similar to those of the semiconductor device A1 are given the same numeral, and the description thereof will not be repeated. FIG. 21 is a bottom view showing the semiconductor device A10, and corresponds to FIG. 5 showing the semiconductor device A1 according to the first embodiment.

The semiconductor device A10 according to this embodiment is different from the semiconductor device A9 according to the ninth embodiment, in the following aspects. The semiconductor device A10 includes a semiconductor element 7 having four electrodes. The semiconductor device A10 also includes four leads, electrically connected to the respective electrodes. More specifically, the semiconductor element 7 includes a drain electrode D, a gate electrode G, a driver source electrode DS, and a power source electrode PS. As shown in FIG. 21, the drain electrode D is electrically connected to the lead 1. Likewise, the gate electrode G is electrically connected to the lead 2, the driver source electrode DS is electrically connected to the lead 3, and the power source electrode PS is electrically connected to the lead 4. The leads 1 to 3 respectively include the terminals 120, 220, and 320. Likewise, the lead 4 includes a terminal 420. In the illustrated example, the terminals 220, 320, and 420 are spaced apart from each other in the x-direction, at regular intervals. However, the spacing between the terminal 120 (drain terminal) and the terminal 420 (power source terminal) is larger than the spacing between the terminal 320 (driver source terminal) and the terminal 420 (power source terminal). As a matter of course such a configuration is merely exemplary, and the present disclosure is not limited to the mentioned configuration.

In the semiconductor device A10 also, like in the semiconductor device A9 (see FIG. 19), the sealing resin 8 includes the back face groove 87 extending in the x-direction. In the illustrated example, the back face groove 87 continuously extends from the left edge of the sealing resin 8, and ends before the drain terminal 120 (at a position between the end face protrusion 85 and the end face protrusion 86). As a matter of course, the present disclosure is not limited to such a configuration. For example, as shown in FIG. 17, the back face groove 87 may extend all the way from the left edge to the right edge of the sealing resin 8 or, as shown in FIG. 20, be composed of a plurality of portions spaced apart from each other (see numerals 87 and 87' in FIG. 20). Further, another back face groove (see FIG. 11) may be formed in the sealing resin 8, in addition to the back face groove 87 shown in FIG. 21. Alternatively, a back face protrusion (see numeral 88 in FIG. 12) protruding from the resin back face 82 in the z-direction may be provided, in place of the back face groove 87. In any of the cases, with the semiconductor device A10 having four leads also, forming at least one groove or protrusion at a predetermined position on the sealing resin 8 provides similar advantageous effects to those provided by the foregoing embodiments.

The semiconductor device according to the present disclosure is not limited to the foregoing embodiments. The specific configuration of the elements of the semiconductor device according to the present disclosure may be modified in various manners.

Appendix 1

A semiconductor device including:
a semiconductor element including an element main face and an element back face that face opposite to each other in a thickness direction, a first electrode located on the element back face, and a second electrode located on the element main face;
a first lead including: a mounting base having a mounting base main face to which the first electrode of the semiconductor element is bonded and a mounting base back face opposite to the mounting base main face in the thickness direction; and a first terminal electrically connected to the first electrode via the mounting base;
a second lead including a second terminal electrically connected to the second electrode; and
a sealing resin covering a part of each of the first lead and the second lead, and the semiconductor element,
in which the first terminal and the second terminal protrude from the sealing resin,
the sealing resin includes: a resin main face and a resin back face oriented in opposite directions to each other in the thickness direction; a resin end face connecting the resin main face and the resin back face, and oriented in the direction in which the first terminal and the second terminal protrude; and a pair of resin side faces each connecting the resin main face and the resin back face, and connected to the resin end face,
the mounting base back face is exposed from the resin back face, and
the sealing resin includes a back face displaced portion located on the resin back face, at a position between the mounting base back face and a boundary between the second terminal and the resin end face, the back face displaced portion including a portion deviated from the resin back face in the thickness direction.

Appendix 2

The semiconductor device according to appendix 1, in which the back face displaced portion does not overlap with the first lead as viewed in the thickness direction.

Appendix 3

The semiconductor device according to appendix 1 or 2, in which the back face displaced portion extends as far as the resin side face on a side of the second terminal.

Appendix 4

The semiconductor device according to any one of appendices 1 to 3, in which the back face displaced portion includes a groove having a rectangular cross-section along a plane parallel to the resin side face.

Appendix 5

The semiconductor device according to any one of appendices 1 to 3, in which the back face displaced portion protrudes from the resin back face, and has a rectangular cross-section along a plane parallel to the resin side face.

Appendix 6

The semiconductor device according to any one of appendices 1 to 5, in which the back face displaced portion includes a plurality of back face displaced portions.

Appendix 7

The semiconductor device according to any one of appendices 1 to 6, in which the first lead further includes a joint portion connected to the mounting base and the first terminal, and the joint portion is inclined with respect to the mounting base and the first terminal.

Appendix 8

The semiconductor device according to any one of appendices 1 to 7, in which the sealing resin includes a resin through-hole formed throughout between the resin main face and the resin back face, and the mounting base includes a mounting base through-hole formed throughout between the mounting base main face and the mounting base back face, the resin through-hole being located inside the mounting base through-hole.

Appendix 9

The semiconductor device according to any one of appendices 1 to 8, in which the sealing resin includes an end face protrusion protruding from the resin end face, and the second terminal protrudes from the end face protrusion.

Appendix 10

The semiconductor device according to appendix 9, in which the sealing resin includes a second end face protrusion spaced apart from the end face protrusion and protruding from the resin end face, and the first terminal protrudes from the second end face protrusion.

Appendix 11

The semiconductor device according to any one of appendices 1 to 10, in which the semiconductor element includes a diode.

Appendix 12

The semiconductor device according to any one of appendices 1 to 10, further including a third lead,
in which the semiconductor element includes a third electrode located on the element main face, the third lead including a third terminal electrically connected to the third electrode.

Appendix 13

The semiconductor device according to appendix 12, in which the sealing resin includes a second back face displaced portion located on the resin back face, at a position between the mounting base back face and a boundary between the third terminal and the resin end face, the second back face displaced portion including a portion deviated from the resin back face in the thickness direction.

Appendix 14

The semiconductor device according to appendix 12, in which the back face displaced portion extends to a position between the mounting base back face and a boundary between the third terminal and the resin end face.

Appendix 15

The semiconductor device according to any one of appendices 1 to 14, in which the semiconductor element includes a transistor.

Appendix 16

The semiconductor device according to appendix 12, further including a fourth lead,
in which the semiconductor element includes a fourth electrode, and the fourth lead includes a fourth terminal electrically connected to the fourth electrode.

The invention claimed is:

1. A semiconductor device comprising:
a semiconductor element including: an element main face and an element back face that face opposite to each other in a thickness direction; a drain electrode located on the element back face; and a gate electrode, a driver source electrode, and a power source electrode that are located on the element main face;
a first lead including: a mounting base having a mounting base main face to which the drain electrode of the semiconductor element is bonded and a mounting base back face opposite to the mounting base main face in the thickness direction;
a first terminal electrically connected to the drain electrode via the mounting base;
a second lead including a second terminal electrically connected to the gate electrode;
a third lead including a third terminal electrically connected to the driver source electrode;
a fourth lead including a fourth terminal electrically connected to the power source electrode;
a sealing resin covering a part of each of the first lead, the second lead, the third lead, the fourth lead, and the semiconductor element,
wherein the sealing resin includes: a resin main face and a resin back face oriented in opposite directions to each other in the thickness direction; a resin end face connecting the resin main face and the resin back face, and oriented in a direction in which the first terminal, the second terminal, the third terminal, and the fourth terminal protrude; a pair of resin side faces each connecting the resin main face and the resin back face; a first depression and a second depression that sandwich the second terminal in the thickness direction, the first depression being recessed from the resin back face in the thickness direction, the second depression being recessed from the resin main face in the thickness direction, the first depression being greater in size in the thickness direction than the second depression; and a gap that is open in the direction in which the first terminal, the second terminal, the third terminal, and the fourth terminal protrude,
the mounting base back face is exposed from the resin back face,
the gap is located between the first terminal and the fourth terminal.

2. The semiconductor device according to claim 1, wherein each of the first depression and the second depression comprises a single bottom face that is flat.

3. The semiconductor device according to claim 1, wherein each of the first depression and the second depression reaches at least one of the pair of resin side faces.

4. The semiconductor device according to claim 1, wherein the first lead includes a joint portion connected to the mounting base and the first terminal, and the joint portion is inclined with respect to the mounting base and the first terminal.

5. The semiconductor device according to claim 1, wherein the sealing resin includes a resin through-hole extending from the resin main face to the resin back face, and the mounting base includes a mounting base through-hole extending from the mounting base main face to the mounting base back face, the resin through-hole being located inside the mounting base through-hole.

6. The semiconductor device according to claim 1, wherein the sealing resin includes an end face protrusion protruding from the resin end face, and the second terminal protrudes from the end face protrusion.

7. The semiconductor device according to claim 6, wherein the sealing resin includes a second end face protrusion spaced apart from the end face protrusion and protruding from the resin end face, and the first terminal protrudes from the second end face protrusion.

8. The semiconductor device according to claim 1, wherein the semiconductor element includes a diode.

9. The semiconductor device according to claim 1, wherein the sealing resin includes a back face displaced portion located on the resin back face, at a position between the mounting base back face and a boundary between the third terminal and the resin end face, and the back face displaced portion including a portion deviated from the resin back face in the thickness direction.

10. The semiconductor device according to claim 9, wherein the back face displaced portion extends to a position between the mounting base back face and a boundary between the third terminal and the resin end face.

11. The semiconductor device according to claim 1, wherein the semiconductor element includes a transistor.

12. The semiconductor device according to claim 1, wherein the first terminal and the second terminal protrude to an outside from the sealing resin.

13. The semiconductor device according to claim 1, wherein the first depression is disposed between the mounting base back face and an interface between a portion of the first second lead exposed from the sealing resin and an edge line of the sealing resin in a plan view.

14. The semiconductor device according to claim 1, wherein the sealing resin includes a first stepped face relative to the resin back face and a second stepped face relative to the resin main face, the first stepped face and the second stepped face being spaced apart from each other in the thickness direction, the first stepped face defining the first depression, the second stepped face defining the second depression.

* * * * *